(12) United States Patent
Shibazaki

(10) Patent No.: US 11,579,532 B2
(45) Date of Patent: *Feb. 14, 2023

(54) EXPOSURE APPARATUS AND EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/563,419

(22) Filed: Dec. 28, 2021

(65) Prior Publication Data

US 2022/0121125 A1   Apr. 21, 2022

Related U.S. Application Data

(62) Division of application No. 17/082,402, filed on Oct. 28, 2020, now Pat. No. 11,256,175, which is a
(Continued)

(30) Foreign Application Priority Data

Oct. 2, 2012   (JP) .................................. 2012-219952

(51) Int. Cl.
*G03F 7/20* (2006.01)
*G01B 11/26* (2006.01)
(Continued)

(52) U.S. Cl.
CPC .......... *G03F 7/70133* (2013.01); *G01B 11/00* (2013.01); *G01B 11/26* (2013.01);
(Continued)

(58) Field of Classification Search
CPC ............. G03F 7/70058; G03F 7/70133; G03F 7/70775; G03F 7/20; G01B 11/00;
(Continued)

(56) References Cited

U.S. PATENT DOCUMENTS 4,780,617 A   10/1988   Umatate et al.
5,196,745 A   3/1993   Trumper
(Continued)

FOREIGN PATENT DOCUMENTS

JP   2009-055034 A   3/2009
JP   2009-252986 A   10/2009
(Continued)

OTHER PUBLICATIONS

Dec. 24, 2013 Search Report issued in International Application No. PCT/JP2013/076820.
(Continued)

*Primary Examiner* — Peter B Kim
(74) *Attorney, Agent, or Firm* — Oliff PLC

(57) ABSTRACT

In corner sections of first to fourth quadrants whose origin point is a center of an upper surface of a stage, three each of two-dimensional heads are provided. The three each of two-dimensional heads include one first head and two second heads. The stage is driven, while measuring a position of the stage using three first heads that face a two-dimensional grating of a scale plate provided above the stage from the four first heads, and during the driving, difference data of measurement values of the two second heads with respect to the first head in a measurement direction are taken in for head groups to which the three first heads belong, respectively, and using the difference data, grid errors are calibrated.

17 Claims, 11 Drawing Sheets

Related U.S. Application Data division of application No. 16/522,716, filed on Jul. 26, 2019, now Pat. No. 10,852,639, which is a division of application No. 15/848,615, filed on Dec. 20, 2017, now Pat. No. 10,409,166, which is a division of application No. 15/585,866, filed on May 3, 2017, now Pat. No. 9,891,531, which is a division of application No. 14/432,522, filed as application No. PCT/JP2013/076820 on Oct. 2, 2013, now Pat. No. 9,678,433.

(51) Int. Cl.
  *G01B 11/00* (2006.01)
  *H01J 37/304* (2006.01)
  *H01J 37/317* (2006.01)

(52) U.S. Cl.
  CPC ...... *G03F 7/70058* (2013.01); *G03F 7/70775* (2013.01); *H01J 37/3045* (2013.01); *H01J 37/3174* (2013.01); *H01J 2237/202* (2013.01); *H01J 2237/3175* (2013.01)

(58) Field of Classification Search
  CPC ............... G01B 11/26; H01J 2237/202; H01J 2237/3175; H01J 37/3174; H01J 37/3045; H01L 21/0274
  See application file for complete search history.

(56) References Cited

U.S. PATENT DOCUMENTS

| | | | |
|---|---|---|---|
| 5,448,332 | A | 9/1995 | Sakakibara et al. |
| 5,646,413 | A | 7/1997 | Nishi |
| 6,611,316 | B2 | 8/2003 | Sewell |
| 6,778,257 | B2 | 8/2004 | Bleeker et al. |
| 7,023,610 | B2 | 4/2006 | Ohtsuki et al. |
| 7,561,280 | B2 | 7/2009 | Schluchter et al. |
| 9,678,433 | B2 | 6/2017 | Shibazaki |
| 9,891,531 | B2 | 2/2018 | Shibazaki |
| 10,409,166 | B2 | 9/2019 | Shibazaki |
| 10,852,639 | B2 | 12/2020 | Shibazaki |
| 11,256,175 | B2 * | 2/2022 | Shibazaki ........... G03F 7/70775 |
| 2003/0025890 | A1 | 2/2003 | Nishinaga |
| 2005/0259234 | A1 | 11/2005 | Hirukawa et al. |
| 2006/0227309 | A1 | 10/2006 | Loopstra et al. |
| 2007/0127006 | A1 | 6/2007 | Shibazaki |
| 2007/0211235 | A1 | 9/2007 | Shibazaki |
| 2007/0288121 | A1 | 12/2007 | Shibazaki |
| 2008/0068568 | A1 | 3/2008 | Ebihara et al. |
| 2008/0088843 | A1 | 4/2008 | Shibazaki |
| 2008/0094592 | A1 | 4/2008 | Shibazaki |
| 2009/0051894 | A1 | 2/2009 | Shibazaki et al. |
| 2011/0051109 | A1 | 3/2011 | Emoto et al. |
| 2011/0053061 | A1 | 3/2011 | Shibazaki |
| 2011/0053062 | A1 | 3/2011 | Shibazaki |
| 2011/0116066 | A1 | 5/2011 | Van Der Pasch et al. |

FOREIGN PATENT DOCUMENTS

| | | |
|---|---|---|
| JP | 2010-062210 A | 3/2010 |
| JP | 2011-49557 A | 3/2011 |
| JP | 2011-49558 A | 3/2011 |
| JP | 2011-54694 A | 3/2011 |
| WO | 99/49504 A1 | 9/1999 |
| WO | 01/35168 A1 | 5/2001 |
| WO | 2011/016254 A1 | 2/2011 |

OTHER PUBLICATIONS

Dec. 24, 2013 Written Opinion of the International Searching Authority issued in International Application No. PCT/JP2013/076820.
Oct. 19, 2015 Extended Search Report issued in European Patent Application No. 13844272.8.
Jun. 25, 2020 U.S. Office Action issued U.S. Appl. No. 16/522,716.
Sep. 23, 2016 Office Action issued in U.S. Appl. No. 14/432,522.
Oct. 8, 2021 Notice of Allowance issued in U.S. Appl. No. 17/082,402.
Feb. 15, 2017 Notice of Allowance issued in U.S. Appl. No. 14/432,522.
Aug. 16, 2021 Office Action Issued in U.S. Appl. No. 17/082,402.
Jun. 6, 2017 Office Action issued in U.S. Appl. No. 15/585,866.
Oct. 4, 2017 Notice of Allowance issued in U.S. Appl. No. 15/585,866.
Aug. 14, 2020 Notice of Allowance issued in U.S. Appl. No. 16/522,716.
Jan. 7, 2019 U.S. Office Action issued U.S. Appl. No. 15/848,615.
May 7, 2019 Notice of Allowance issued in U.S. Appl. No. 15/848,615.

* cited by examiner

EXPOSURE APPARATUS AND EXPOSURE METHOD, AND DEVICE MANUFACTURING METHOD

This is a Divisional of application Ser. No. 17/082,402, filed Oct. 28, 2020, which is a Divisional of application Ser. No. 16/522,716, filed Jul. 26, 2019, which is a Divisional of application Ser. No. 15/848,615, filed Dec. 20, 2017, which is a Divisional of application Ser. No. 15/585,866, filed May 3, 2017, which is a Divisional of application Ser. No. 14/432,522, filed Jun. 10, 2015, which is a 371 National Stage of International Application No. PCT/JP2013/076820, filed Oct. 2, 2013, which claims priority to Japanese Application No. 2012-219952, filed Oct. 2, 2012. The disclosures of the prior applications are hereby incorporated by reference herein in their entirety.

TECHNICAL FIELD

The present invention relates to exposure apparatuses and exposure methods, and device manufacturing methods, and more particularly to an exposure apparatus and an exposure method used in a lithography process for manufacturing microdevices (electronic devices) such as a semiconductor device, and a device manufacturing method which uses the exposure apparatus or the exposure method.

BACKGROUND ART

Conventionally, in a lithography process to manufacture electronic devices (microdevices) such as semiconductor devices (integrated circuits and the like) and liquid crystal display devices, a projection exposure apparatus of a step-and-repeat method (a so-called stepper), a projection exposure apparatus of a step-and-scan method (so-called scanning stepper (also called a scanner)) and the like are mainly used.

In this type of exposure apparatus, along with finer device patterns due to higher integration of semiconductor devices, requirements for high overlay accuracy (alignment accuracy) are increasing. Therefore, requirements are increasing for higher accuracy on position measurement of substrates such as a wafer or a glass plate and the like on which a pattern is formed.

As a device for satisfying such requirements, for example, in PTL 1, an exposure apparatus is proposed equipped with a position measurement system that uses a plurality of encoder type sensors (encoder heads) which are mounted on a substrate table. In this exposure apparatus, the encoder heads measure a position of the substrate table by irradiating measurement beams on a scale which is placed facing the substrate table and receiving return beams from the scale.

However, as a premise for the exposure apparatus according to PTL 1 equipped with the position measurement system to achieve exposure with high precision, grating pitch and grating shape of the grating that the scale has are "not to vary at all" for over a long period of time. Further, even if the grid varies, there are no means for monitoring the variation except for monitoring the variation based on exposure results.

However, when considering that a permissible value of a positioning error required in a wafer stage of the current exposure apparatus is at a nm level, it is difficult to think that the grid will not vary over a long time when viewed at a nm level.

Further, transition from an age of a 300 mm wafer to an age of a 450 mm wafer is near at hand and when it comes to an exposure apparatus handling 450 mm wafers, it is considered that while the wafer stage increases in size, the permissible value of the positioning error will become tighter than the present (or around the same as the current level). Using the position measurement system according to PTL 1 described above in the exposure apparatus handling 450 mm wafers without any changes is considered to be difficult, when considering a further increase in the size of the scale (grating) that accompanies larger wafers.

A similar problem also occurs in an exposure apparatus disclosed in, for example, PTL 2 and the like that is equipped with an encoder system.

CITATION LIST

Patent Literature

[PTL 1] U.S. Patent Application Publication No. 2006/0227309

[PTL 2] U.S. Patent Application Publication No. 2008/0088843

SUMMARY OF THE INVENTION

Solution to Problem

The present invention was made under the circumstances described above, and according to its first aspect, there is provided a first exposure apparatus which exposes an object with an energy beam and forms a pattern on the object, the apparatus comprising: a movable body which is movable along a plane including a first axis and a second axis that are orthogonal to each other holding the object, a position measurement system which has a plurality of heads placed at one of the movable body and an outside of the movable body that irradiates a measurement beam from a part of the plurality of heads onto a measurement surface placed on an other of the movable body and the outside of the movable body, receives a return beam from the measurement surface, and measures positional information of the movable body, and a control system which drives the movable body based on the positional information, wherein a one-dimensional or a two-dimensional grating is formed on the measurement surface, the plurality of heads includes a first head group placed within a predetermined plane facing the measurement surface that includes at least three heads having a measurement direction in at least one direction of two directions within the predetermined plane and a direction orthogonal to the predetermined plane, and of the at least three heads, at least two heads are placed on a same straight line within the predetermined plane, and at least one head remaining is placed at a position different from the straight line within the predetermined plane, and the at least one head is a reference head used for acquiring the positional information, and the at least two heads are measurement heads used for measuring a difference of measurement values in the measurement direction with respect to measurement values of the reference head.

According to this apparatus, the movable body is driven by the control system, based on positional information obtained by the position measurement system. Further, difference of measurement values in the measurement direction is measured for at least one reference head and the remaining at least two measurement heads, respectively, which are used for obtaining the positional information belonging to the first head group. This measurement of the difference, by being performed concurrently with the movement of the movable body, allows variation quantity of the grid in the measurement direction of the measurement surface to be monitored, based on data of the difference.

According to a second aspect of the present invention, there is provided a second exposure apparatus that exposes an object with an energy beam and forms a pattern on the object, the apparatus comprising: a movable body which holds the object and is movable along a plane including a first axis and a second axis which are orthogonal to each other; a position measurement system which has a plurality of heads placed at one of the movable body and outside of the movable body that irradiates a measurement beam from a part of the plurality of heads on a measurement surface placed at an other of the movable body and the outside of the movable body, receives a return beam from the measurement surface, and measures positional information of the movable body; and a control system which drives the movable body based on the positional information, wherein one of a one-dimensional and a two-dimensional grating is formed on the measurement surface, and the plurality of heads are placed within a predetermined plane facing the measurement surface and includes a head group including at least two heads whose measurement directions are in at least one direction of at least a first direction and a second direction within the predetermined plane and a direction orthogonal to the predetermined plane, and two of the at least two heads are placed apart in a direction intersecting each axis which are an axis along the first direction and an axis along the second direction within the predetermined plane, and one head of the two heads is a reference head used for acquiring the positional information, and a remaining one head of the two heads is a measurement head used for measuring a difference of measurement values in the measurement direction with respect to measurement values of the reference head.

According to a third aspect of the present invention, there is provided a device manufacturing method comprising: forming a pattern on an object using one of the first and the second exposure apparatus described above; and developing the object on which the pattern is formed.

According to a fourth aspect of the present invention, there is provided a first exposure method in which an object is exposed with an energy beam and a pattern is formed on the object, the method comprising: irradiating a measurement beam from a part of a plurality of heads placed on one of a movable body which moves holding the object along a plane including a first axis and a second axis orthogonal to each other and an outside of the movable body on a measurement surface placed on an other of the movable body and the outside of the movable body on which a one-dimensional or a two-dimensional grating is formed, receiving a return beam from the measurement surface, and measuring positional information of the movable body; and driving the movable body based on the positional information that has been obtained, wherein, the plurality of heads includes a first head group, placed within a predetermined plane facing the measurement surface, the heads including at least three heads whose measurement directions are in at least two directions within the predetermined plane and at least one direction orthogonal to the predetermined plane, and of the at least three heads, at least two heads are placed on a same straight line within the predetermined plane, and at least a remaining head is placed within the predetermined plane at a position different from the straight line, and in the driving, the movable body is driven within the predetermined plane, and concurrently with this driving, difference data of measurement values in the measurement direction of different heads belonging to the first head group is taken in, and grid errors in the measurement direction of the measurement surface are calibrated based on the difference data taken in, the difference data including difference data of measurement values in the measurement direction, of measurement values of a reference head which is the at least one head used for measuring the positional information and measurement values of each measurement head of the at least two heads, belonging to the first head group.

According to this method, the movable body is driven based on the positional information that has been obtained, and concurrently with moving the movable body within the predetermined plane, difference data in the measurement direction of different heads belonging to the first group including difference data of measurement values in the measurement direction of at least one reference head and the remaining at least two measurement heads, respectively, which are used for obtaining the positional information belonging to the first head group are taken in, and based on the difference data which has been taken in, calibration is performed of grid errors in the measurement direction of the measurement surface.

According to a fifth aspect of the present invention, there is provided a second exposure method in which an object is exposed with an energy beam and a pattern is formed on the object, the method comprising: irradiating a measurement beam from a part of a plurality of heads placed on one of a movable body which moves holding the object along a plane including a first axis and a second axis orthogonal to each other and an outside of the movable body on a measurement surface placed on an other of the movable body and the outside of the movable body on which a one-dimensional or a two-dimensional grating is formed, receiving a return beam from the measurement surface, and measuring positional information of the movable body; and driving the movable body based on the positional information that has been obtained, wherein, the plurality of heads includes a head group including at least two heads, placed within a predetermined plane facing the measurement surface, whose measurement directions are in at least one direction of at least two directions within the predetermined plane and a direction orthogonal to the predetermined plane, and two heads of the at least two heads are placed apart in a direction intersecting each axis which are an axis along the first direction within the predetermined plane and an axis along the second direction, and in the driving, the movable body is driven within the predetermined plane, and concurrently with this driving, difference data of measurement values in the measurement direction of different heads belonging to the head group is taken in, and based on the difference data taken in, grid errors in the measurement direction of the measurement surface are calibrated, the difference data including difference data of measurement values in the measurement direction of measurement values of a reference head used for measuring the positional information which is one head of the two heads belonging to the head group and measurement values of one head remaining of the two heads.

According to a sixth aspect of the present invention, there is provided a device manufacturing method, comprising: forming a pattern on the object by one of the first and the second exposure methods described above; and developing the object on which the pattern is formed.

DESCRIPTION OF EMBODIMENT

Hereinafter, an embodiment of the present invention will be described, based on FIGS. 1 to 10.

Figure 1:
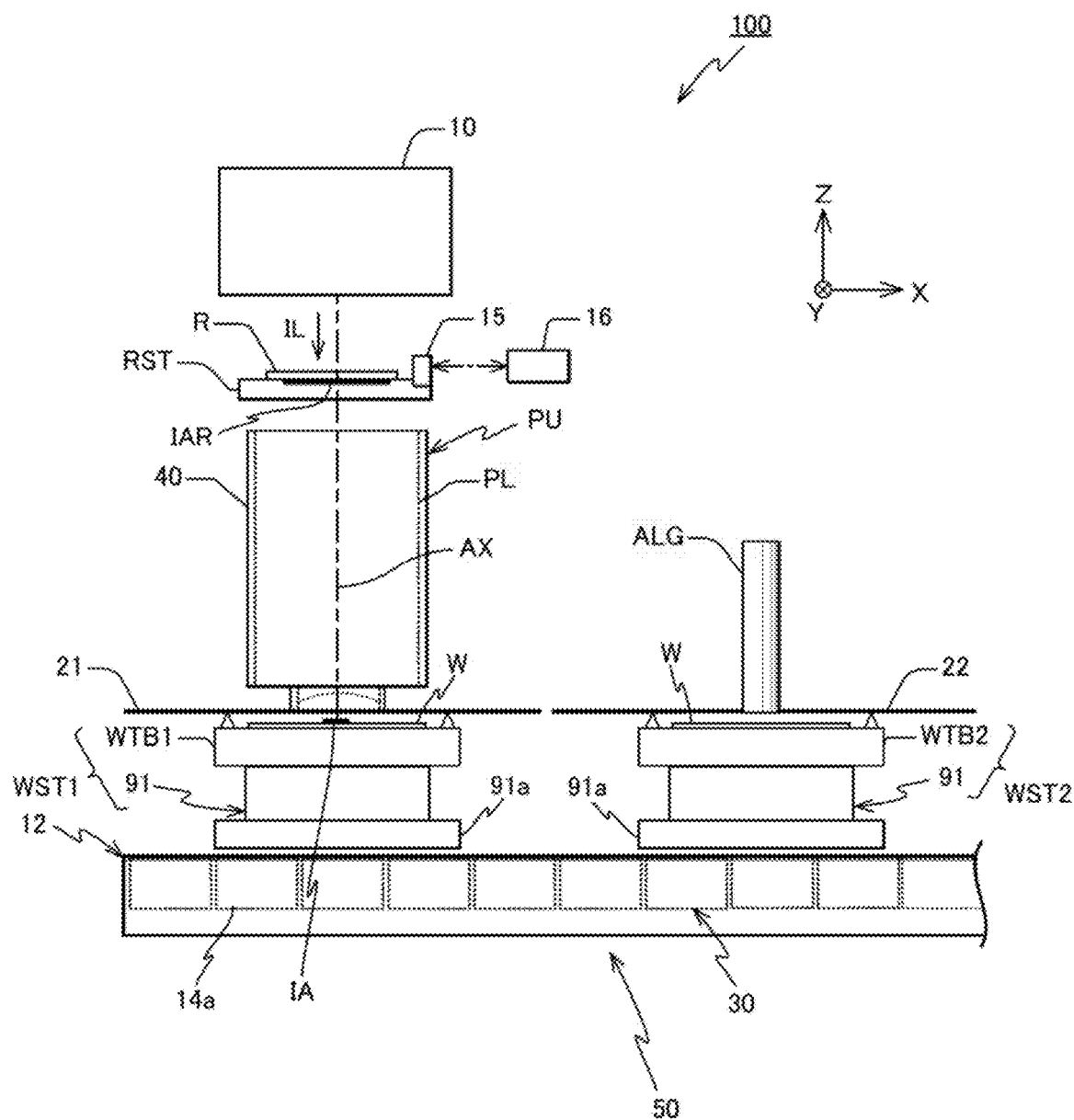
FIG. 1 is a view that schematically shows a structure of an exposure apparatus related to an embodiment.

FIG. 1 shows a schematic structure of an exposure apparatus 100 related to the embodiment. Exposure apparatus 100 is a projection exposure apparatus of a step-and-scan method, or a so-called scanner. As it will be described later on, a projection optical system PL is provided in the present embodiment, and in the description below, the description will be made with a direction parallel to an optical axis AX of projection optical system PL described as a Z-axis direction, a direction in which a reticle and a wafer are relatively scanned within a plane orthogonal to the Z-axis direction described as a Y-axis direction, a direction orthogonal to the Z-axis and the Y-axis described as an X-axis direction, and rotation (tilt) directions around the X-axis, the Y-axis and the Z-axis described as a θx direction, a θy direction and a θz direction, respectively.

Exposure apparatus 100 is equipped with an illumination system 10, a reticle stage RST which holds a reticle R, a projection unit PU, a wafer stage device 50 including wafer stages WST1, WST2 on which a wafer W is mounted, a control system for these parts and the like.

Illumination system 10 includes a light source, and an illumination optical system which has an illuminance equalizing optical system including an optical integrator and the like, a reticle blind and the like (each of which are not shown), as is disclosed in, for example, U.S. Patent Application Publication No. 2003/0025890 and the like. Illumination system 10 illuminates a slit shaped illumination area IAR on reticle R set (limited) by the reticle blind (masking system) with illumination light (exposure light) IL at an almost equal illuminance. Here, as illumination light IL, an ArF excimer laser beam (wavelength 193 nm) is used as an example.

On reticle stage RST, reticle R which has a circuit pattern and the like is formed on its pattern surface (a lower surface in FIG. 1) is fixed, for example, by vacuum chucking. Reticle stage RST is finely drivable within an XY plane and is drivable in a scanning direction (the Y-axis direction which is a direction orthogonal to the page surface in FIG. 1) at a predetermined scanning velocity by a reticle stage driving system 11 (not shown in FIG. 1, refer to FIG. 9) that includes, for example, a linear motor and the like.

Positional information (including information on position in the θz direction (θz rotation quantity)) of reticle stage RST within the XY plane (movement plane) is constantly detected by a reticle laser interferometer (hereinafter referred to as a "reticle interferometer") 16 shown in FIG. 1 that irradiates a measurement beam on a movable mirror 15 (in practice, a Y movable mirror (or a retroreflector) having a reflection surface orthogonal to the Y-axis direction and an X movable mirror having a reflection surface orthogonal to the X-axis direction are provided), at a resolution of, for example, around 0.25 nm. Incidentally, to measure positional information of reticle R at least in directions of three degrees of freedom, instead of, or in combination with reticle interferometer 16, an encoder system as is disclosed in, for example, U.S. Patent Application Publication No. 2007/0288121 and the like can be used.

Projection unit PU is placed below reticle stage RST in FIG. 1 (on the −Z side), and is held by a main frame (metrology frame) which structures a part of a body which is not shown. Projection unit PU has a barrel 40, and projection optical system PL consisting of a plurality of optical elements held by barrel 40. As projection optical system PL, for example, a dioptric system is used consisting of a plurality of optical elements (lens elements) arranged along an optical axis AX parallel to the Z-axis direction. Projection optical system PL, for example, is double telecentric, and has a predetermined projection magnification (such as, for example, ¼ times, ⅕ times or ⅛ times). Therefore, when illumination area IAR is illuminated by illumination light IL from illumination system 10, by illumination light IL which has passed reticle R which is placed so that its pattern surface almost coincides with a first plane (an object plane) of projection optical system PL, a reduced image of a circuit pattern of reticle R within illumination area IAR (a reduced image of a part of the circuit pattern) is formed via projection optical system PL, on an area (exposure area) IA conjugate with illumination area IAR on wafer W which has its surface coated with a resist (a sensitive agent) that is placed on a second plane (image plane) side of projection optical system PL. Then, by synchronous driving of reticle stage RST and wafer stage WST1 or WST2, scanning exposure of one shot area (divided area) on wafer W is performed and the pattern of reticle R is transferred on the shot area, with reticle R being relatively moved in the scanning direction (the Y-axis direction) with respect to illumination area IAR (illumination light IL) while wafer W is relatively moved in the scanning direction (the Y-axis direction) with respect to exposure area IA (illumination light IL). That is, in the present embodiment, the pattern of reticle R is generated on wafer W by illumination system 10 and projection optical system PL, and the pattern is formed on wafer W by exposing a sensitive layer (a resist layer) on wafer W by illumination light IL.

Incidentally, the main frame can either be of a conventional gate type, or a suspension support type as is disclosed in, for example, U.S. Patent Application Publication No. 2008/0068568 and the like.

Figure 2:
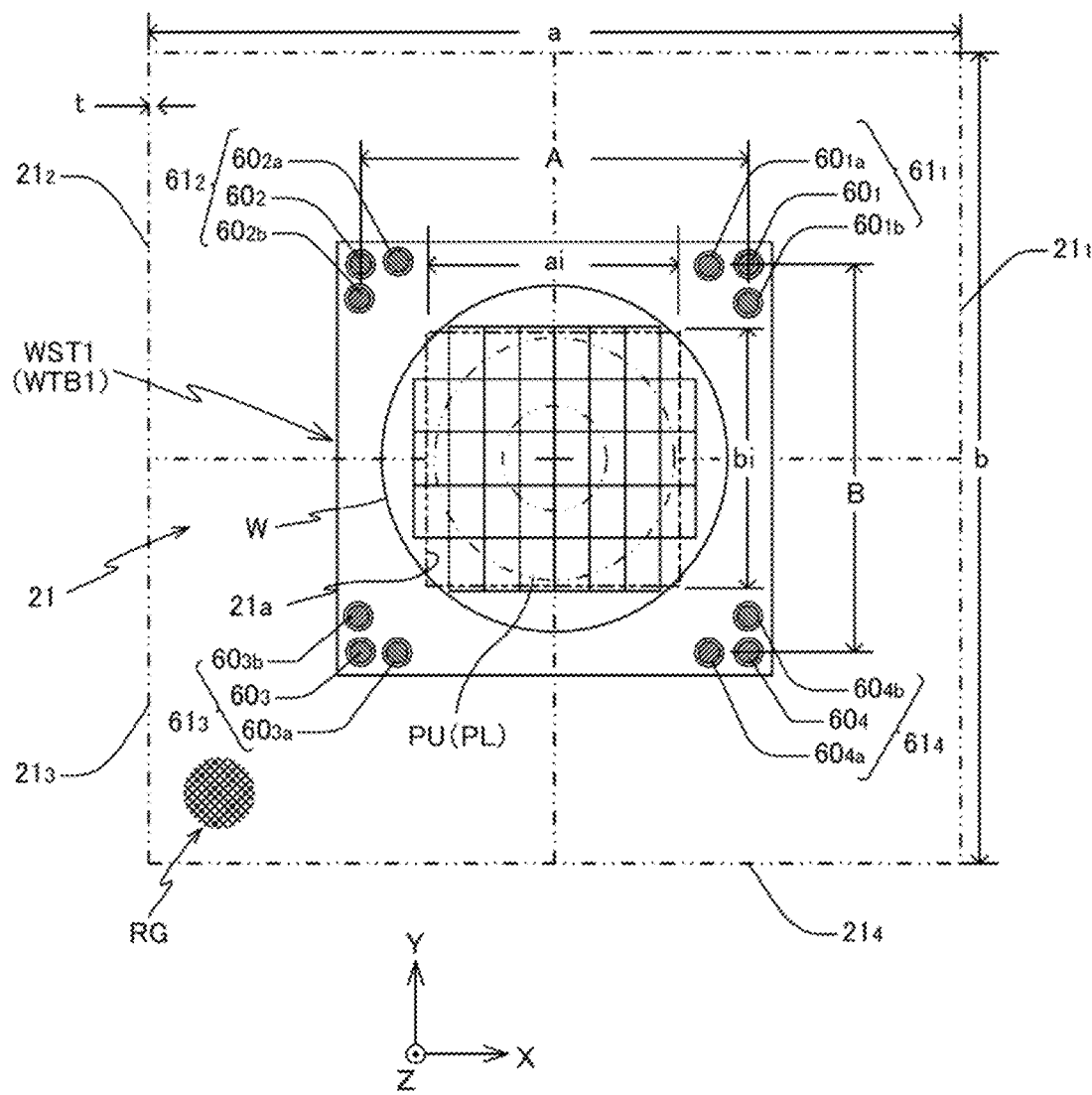
FIG. 2 is a view that shows a structure of an encoder system placed around a projection optical system.

In the periphery of a −Z side edge of barrel 40, a scale plate 21 is placed parallel to the XY plane, for example, at a height substantially flush with the lower end surface of barrel 40. Scale plate 21 in the present embodiment as is shown in FIG. 2 is structured, for example, from four L-shaped sections (components) $21_1$, $21_2$, $21_3$ and $21_4$, and in the center, for example, a rectangular-shaped opening 21a is formed into which the −Z side end of barrel 40 is inserted. Here, the width of scale plate 21 in the X-axis direction and in the Y-axis direction are a and b, respectively, and the width of opening 21a in the X-axis direction and in the Y-axis direction are ai and bi, respectively.

Figure 3:
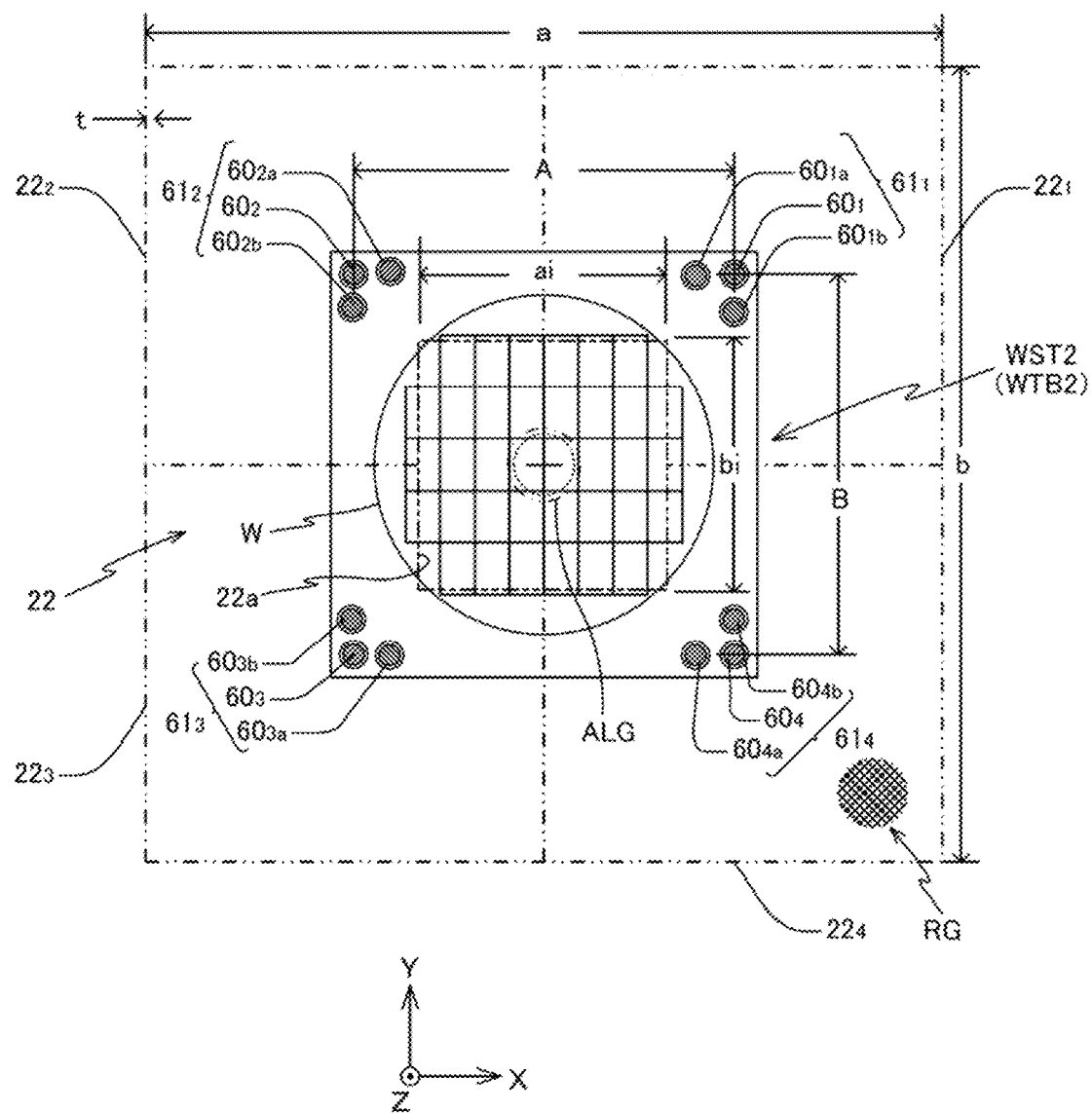
FIG. 3 is a view that shows a structure of an encoder system placed around an alignment system.

At a position spaced apart from scale plate 21 in the +X direction, as is shown in FIG. 1, a scale plate 22 is placed substantially flush with scale plate 21. Scale plate 22, as is shown in FIG. 3, is also structured, for example, from four L-shaped sections (components) $22_1$, $22_2$, $22_3$ and $22_4$, and in the center, for example, a rectangular-shaped opening 22a is formed into which the −Z side end of an alignment system ALG which will be described later is inserted. The width of scale plate 22 is a in the X-axis direction and is b in the Y-axis direction, respectively, and the width of opening 22a is ai in the X-axis direction and is bi in the Y-axis direction, respectively. Incidentally, in the present embodiment, while the width of scale plates 21, 22 and the width of openings 21a, 22a were the same in the X-axis and the Y-axis directions, respectively, the width does not necessarily have to be the same, and the width can be different in at least one of the X-axis and the Y-axis directions.

In the present embodiment, scale plates 21, 22 are supported in a suspended manner by the main frame (metrology frame) which is not shown supporting projection unit PU and alignment system ALG. On a lower surface (−Z side surface) of scale plates 21, 22, a reflection type two-dimensional grating RG (refer to FIGS. 2, 3 and 5) is formed, consisting of a grating that has a predetermined pitch of, for example, 1 μm having a periodic direction in a −45 degrees direction (a −135 degrees direction when the Y-axis serves as a reference) with the X-axis serving as a reference, and a grating that has a predetermined pitch of, for example, 1 μm having a periodic direction in a 45 degrees direction (a −45 degrees direction when the Y-axis serves as a reference) with the X-axis serving as a reference. However, due to the structure of two-dimensional grating RG and encoder heads to be described later on, a non-effective area of a width t is included in each of the vicinity of the outer periphery of each of sections $21_1$ to $21_4$, $22_1$ to $22_4$ structuring scale plates 21, 22. Two-dimensional grating RG of scale plates 21, 22 covers at least a movement range of wafer stages WST1, WST2 at the time of exposure operation and at the time of alignment (measurement), respectively.

Wafer stage device 50, as is shown in FIG. 1, is equipped with a stage base 12 supported substantially horizontal on a floor surface by a plurality of (for example, three or four) vibration-proof mechanisms (omitted in drawings), wafer stages WST1, WST2 placed on stage base 12, a wafer stage driving system 27 (only a part of the system is shown in FIG. 1, refer to FIG. 9) for driving wafer stages WST1, WST2, and a measurement system and the like which measures a position of wafer stages WST1, WST2. The measurement system is equipped with encoder systems 70, 71 and a wafer laser interferometer system (hereinafter shortly referred to as wafer interferometer system) 18 and the like shown in FIG. 9. Incidentally, encoder systems 70, 71 and wafer interferometer system 18 will be described furthermore later in the description. However, in the present embodiment, wafer interferometer system 18 does not necessarily have to be provided.

Stage base 12, as is shown in FIG. 1, is made up of a member that has a plate-like outer shape, and its upper surface is finished to a high flatness and serves as a guide surface when wafer stages WST1, WST2 move. Inside stage base 12, a coil unit is housed that includes a plurality of coils 14a placed in a shape of a matrix with an XY two-dimensional direction serving as a row direction and a column direction.

Incidentally, another base member can be provided to support stage base 12 in a levitated manner separately so that stage base 12 functions as a counter mass (reaction force canceller) which moves according to the momentum conservation law by an action of a reaction force of the driving force of wafer stages WST1, WST2.

Figure 9:
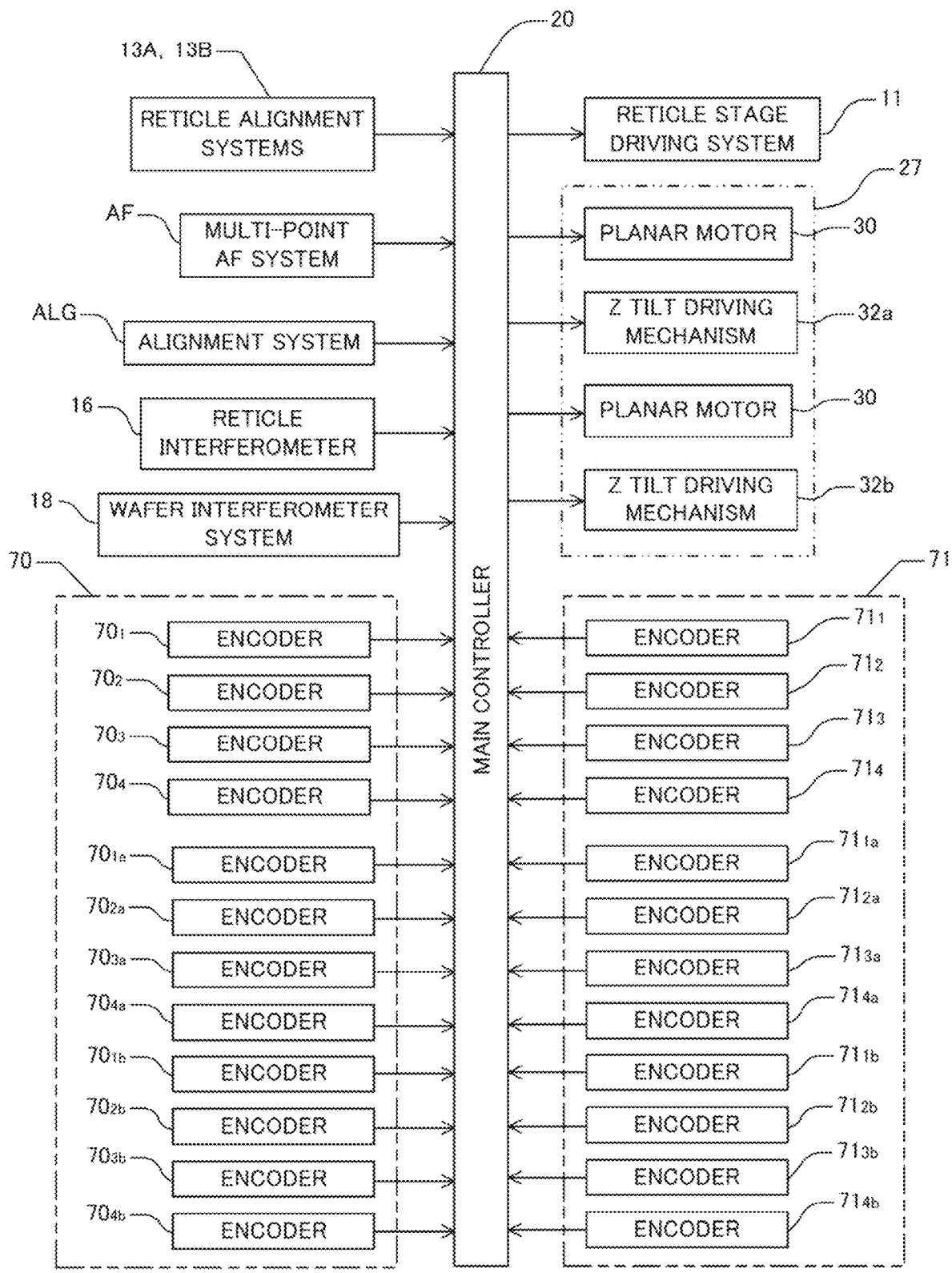
FIG. 9 is a block diagram that shows a main structure of a control system related to stage control of the exposure apparatus in FIG. 1.

Wafer stage WST1, as is shown in FIG. 1, has a stage main section 91, and a wafer table WTB1 which is placed above stage main section 91 and is supported in a non-contact manner with respect to stage main section 91 by a Z tilt driving mechanism 32a (not shown in FIG. 1, refer to FIG. 9). Similarly, wafer stage WST2, as is shown in FIG. 1, has stage main section 91, and a wafer table WTB2 which is placed above stage main section 91 and is supported in a non-contact manner with respect to stage main section 91 by a Z tilt driving mechanism 32b (not shown in FIG. 1, refer to FIG. 9).

In the present embodiment, because wafer stage WST2 and wafer stage WST1 are structured similarly, hereinafter, wafer stage WST1 will be discussed and described representatively.

Wafer table WTB1 is supported in a non-contact manner by Z tilt driving mechanism 32a by adjusting a balance of an upward force (repulsive force) such as an electromagnetic force and a downward force (a gravitational force) including self-weight at three points, and is finely driven at least in directions of three degrees of freedom which are the Z-axis direction, the θx direction, and the θy direction. A slider section 91a is provided at a bottom section of stage main section 91. Slider section 91a has a magnet unit consisting of a plurality of magnets having an XY two-dimensional arrangement within the XY plane, a housing which houses the magnet unit, and a plurality of air bearings provided at a periphery of a bottom surface of the housing. The magnet unit structures a planar motor 30 along with the coil unit previously described that performs an electromagnetic force (Lorentz force) drive as is disclosed in, for example, U.S. Pat. No. 5,196,745 and the like. Incidentally, as planar motor 30, the motor is not limited to a planar motor of the Lorentz force driving method, and a planar motor of a variable magneto-resistance driving method can also be used.

Wafer stage WST1 is supported in a levitated manner by a predetermined clearance (clearance/spacing/void (gap)/spatial distance) on stage base, for example, via a clearance of around several μm by the plurality of air bearings described above, and is driven in the X-axis direction, the Y-axis direction and the θz direction by planar motor 30. Accordingly, wafer table WTB1 (wafer W) can be driven in directions of six degrees of freedom (the X-axis direction, the Y-axis direction, the Z-axis direction, the θx direction, θy direction and the θz direction (hereinafter shortly described as X, Y, Z, θx, θy, and θz)) with respect to stage base 12.

Magnitude and direction of the electric current supplied to each coil 14a structuring the coil unit is controlled by a main controller 20. In the present embodiment, as is shown in FIG. 9, wafer stage driving system 27 is structured including a pair of planar motors 30 having a common stator (coil unit) which drives each of wafer stages WST1 and WST2, and Z tilt driving mechanisms 32a, 32b that wafer stages WST1 and WST2 are equipped with, respectively. Incidentally, planar motor 30 is not limited to a motor of a moving magnet method, and can also be a motor of a moving coil method. Further, as planar motor 30, a planar motor of a magnetic levitation method can also be used. In this case, the air bearings previously described do not have to be provided. Further, wafer stage WST1 can be driven in directions of six degrees of freedom by planar motor 30. Further, wafer table WTB1 can be finely driven in at least one direction of the X-axis direction, the Y-axis direction, and the θz direction. That is, wafer stage WST1 can be structured by a coarse/fine movement stage.

On wafer table WTB1, wafer W is mounted via a wafer holder which is not shown, and is fixed by a chuck mechanism which is not shown, for example, by vacuum chucking (or electrostatic suction). Although it is omitted in the drawings, on wafer table WTB1, one or a plurality of reference mark members is provided on which a plurality of reference marks such as a pair of first reference marks and a second reference mark are formed that are detected by a pair of reticle alignment systems 13A, 13B and alignment system ALG, respectively.

Encoder systems 70, 71 obtain (measure) positional information of wafer tables WTB1, WTB2 in directions of six degrees of freedom (X, Y, Z, θx, θy, θz) in a movement area at the time of exposure including an area directly below projection optical system PL and a movement area at the time of measurement including an area directly below alignment system ALG, respectively. Here, a structure and the like of encoder systems 70, 71 will be described in detail. Incidentally, movement area at the time of exposure (a first movement area) is an area in which the wafer stage is moved during an exposure operation within an exposure station (a first area) where exposure of the wafer is performed via projection optical system PL, and the exposure operation, for example, is not only exposure of all shot areas on the wafer onto which the pattern should be transferred, but also includes preparatory operations for the exposure (for example, detection of reference marks previously described) and the like. Movement area at the time of measurement (a second movement area) is an area in which the wafer stage is moved during a measurement operation within a measurement station (a second area) where measurement of the positional information is performed by detection of alignment marks of the wafer by alignment system ALG, and the measurement operation, for example, is not only detection of a plurality of alignment marks on the wafer, but also includes detection of reference marks by alignment system ALG (furthermore, measurement of positional information (height difference information) of the wafer in the Z-axis direction) and the like.

Figure 4:
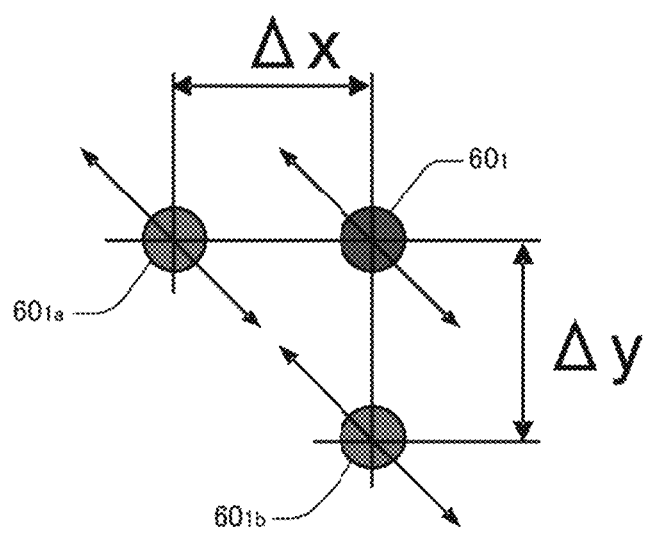
FIG. 4 is a view for explaining an example of a placement of three heads belonging to a first head group placed at a corner section of a first quadrant on a wafer table upper surface.

In wafer tables WTB1, WTB2, as is shown in the planar view in FIGS. 2 and 3, with a center of the upper surface serving as an origin point (coincides with the center of wafer W), a first encoder head group $61_1$, a second encoder head group $61_2$, a third encoder head group $61_3$, and a fourth encoder head group $61_4$ are placed in a part of each corner of a first quadrant, a second quadrant, a third quadrant and a fourth quadrant. Incidentally, in the following description, the encoder head group will be shortly described as a head group. The first head group $61_1$ includes three encoder heads (hereinafter appropriately referred to as heads) $60_1$, $60_{1a}$, $60_{1b}$ placed in the corner section at the +X side and the +Y side on the upper surface of wafer tables WTB1, WTB2. The three heads $60_1$, $60_{1a}$, $60_{1b}$ in the present embodiment are placed at each apex position of a right triangle. To be more specific, head $60_1$ is provided at the vicinity of the corner (apex) at the +X side and the +Y side on the upper surface of wafer tables WTB1, WTB2. Head $60_{1a}$, as is shown enlarged in FIG. 4, is placed at a point shifted by Δx in a −X direction from an installation position of head $60_1$. Further, head $60_{1b}$ is placed at a point shifted by Δy in a −Y direction from an installation position of head $60_1$.

Referring back to FIG. 2 (or FIG. 3), the second head group $61_2$ includes three heads $60_2$, $60_{2a}$, $60_{2b}$ placed in the corner section at the −X side and the +Y side on the upper surface of wafer tables WTB1, WTB2. The three heads $60_2$, $60_{2a}$, $60_{2b}$ in the present embodiment are provided in an arrangement symmetrical to the three heads $60_1$, $60_{1a}$, $60_{1b}$ on wafer tables WTB1, WTB2, with respect to a straight line (center line) parallel to the Y-axis that passes through the center of the upper surface (the origin point described above).

The third head group $61_3$ includes three heads $60_3$, $60_{3a}$, $60_{3b}$ placed in the corner section at the −X side and the −Y side on the upper side of wafer tables WTB1, WTB2. The three heads $60_3$, $60_{3a}$, $60_{3b}$ in the present embodiment are provided in an arrangement symmetrical (point symmetric) to the three heads $60_1$, $60_{1a}$, $60_{1b}$ on wafer tables WTB1, WTB2, with respect to the center of the upper surface.

The fourth head group $61_4$ includes three heads $60_4$, $60_{4a}$, $60_{4b}$ placed in the corner section at the +X side and the −Y side on the upper surface of wafer table WTB1, WTB2. The three heads $60_4$, $60_{4a}$, $60_{4b}$ in the present embodiment are provided in an arrangement symmetrical to the three heads $60_1$, $60_{1a}$, $60_{1b}$ on wafer tables WTB1, WTB2, with respect to a straight line (center line) parallel to the X-axis that passes through the center of the upper surface.

As is shown in FIG. 2, a separation distance between heads $60_1$ and $60_2$ in the X-axis direction and the separation distance between heads $60_3$ and $60_4$ in the X-axis direction are equally A. Further, a separation distance between heads $60_1$, $60_4$ in the Y-axis direction and the separation distance between heads $60_2$ and $60_3$ in the Y-axis direction are equally B. These separation distances A, B are larger than widths ai, bi of opening 21a of scale plate 21. In a precise sense, A≥ai+2t, B≥bi+2t, taking into consideration width t of the non-effective area previously described. Each of head $60_1$ to $60_4$, $60_{1a}$ to $60_{4a}$, and $60_{1b}$ to $60_{4b}$, as is shown representatively taking up head $60_1$ in FIG. 5, are each housed inside holes of a predetermined depth in the Z-axis direction formed in wafer tables WTB1, WTB2.

Figure 6:
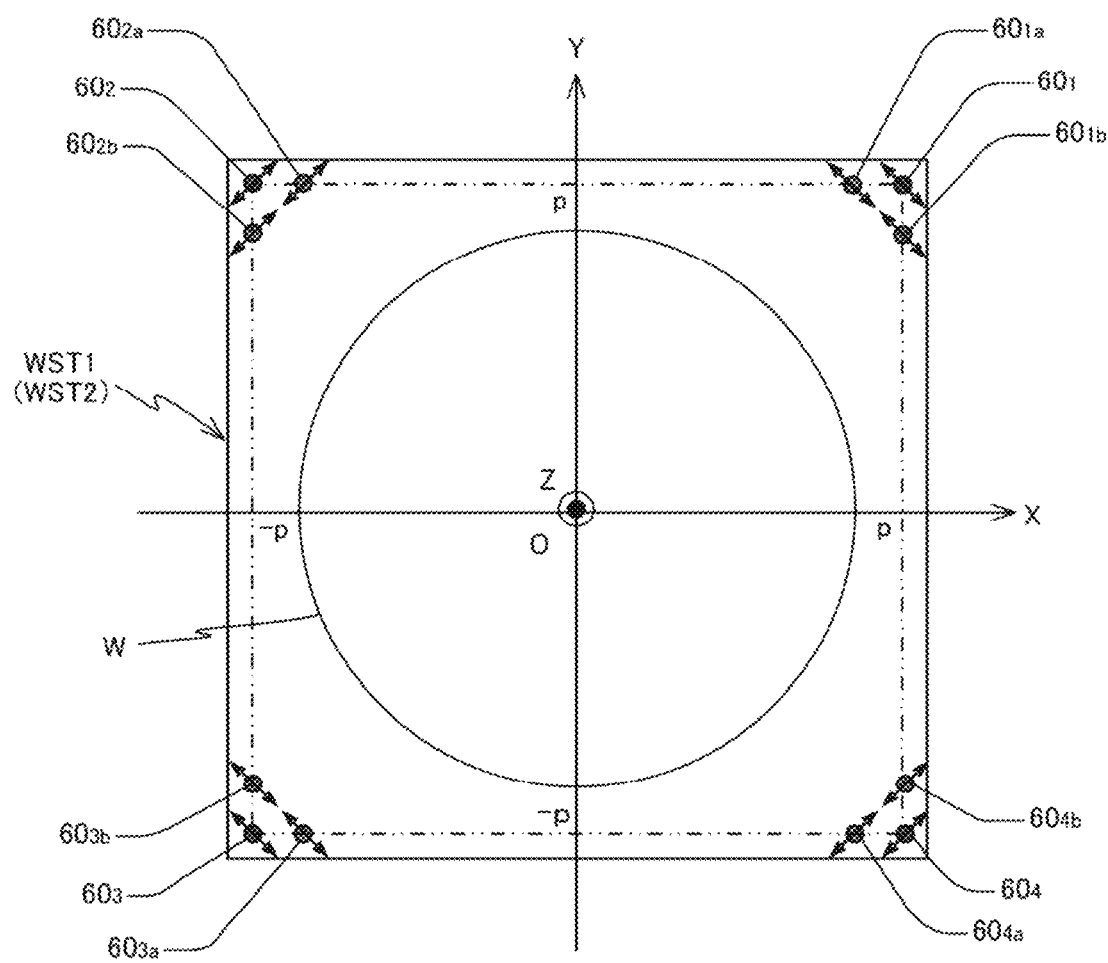
FIG. 6 is a view that shows a placement of encoder heads on the wafer stage.
Figure 7:
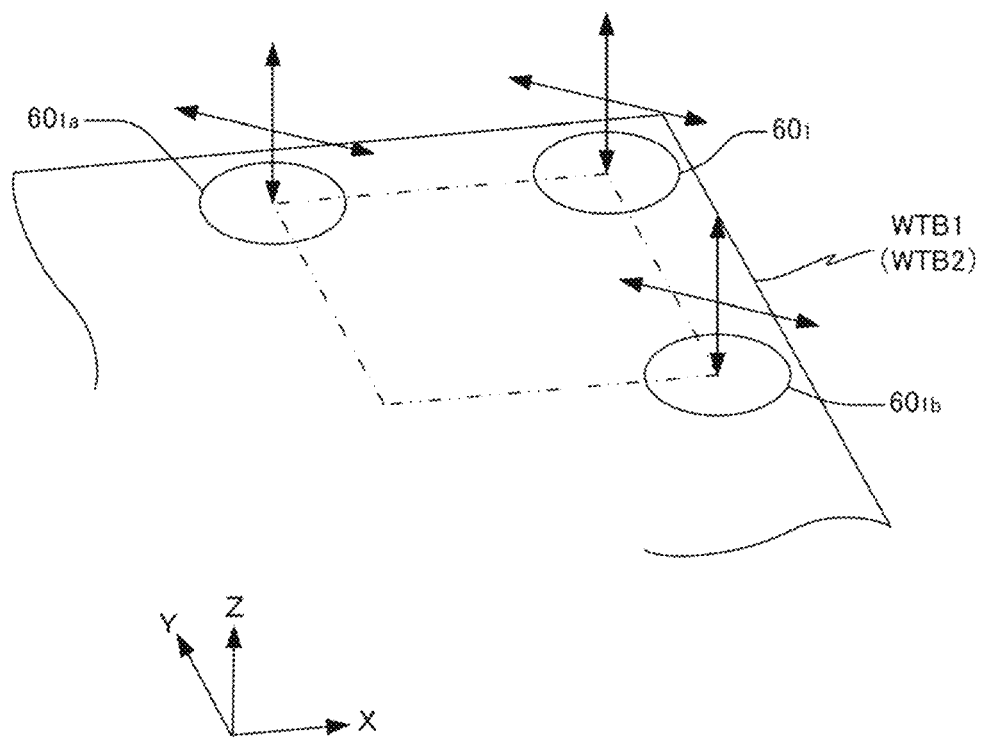
FIG. 7 is a view that shows a placement and a measurement direction of the first head group placed at the corner section of the first quadrant on the wafer table upper surface.
Figure 8A:
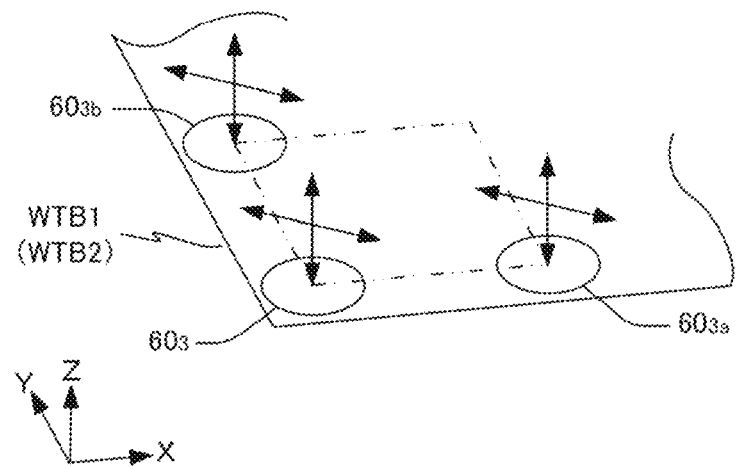
FIGS. 8A to 8C are views that show a placement and a measurement direction of a third head group placed at a corner section of a third quadrant on the wafer table upper surface, a second head group placed at a corner section of a second quadrant on the wafer table upper surface, and a fourth head group placed at a corner section of a fourth quadrant on the wafer table upper surface, respectively.

Heads $60_1$, $60_{1a}$, $60_{1b}$ belonging to the first head group $61_1$, as is shown in FIGS. 6 and 7, are two-dimensional heads whose measurement directions are in a direction of 135 degrees (−45 degrees) with the X-axis as a reference and in the Z-axis direction. Similarly, heads $60_3$, $60_{3a}$, $60_{3b}$ belonging to the third head group $61_3$, as is shown in FIGS. 6 and 8A, are two-dimensional heads whose measurement directions are in the direction of 135 degrees (−45 degrees) with the X-axis as a reference and in the Z-axis direction.

Figure 8B:
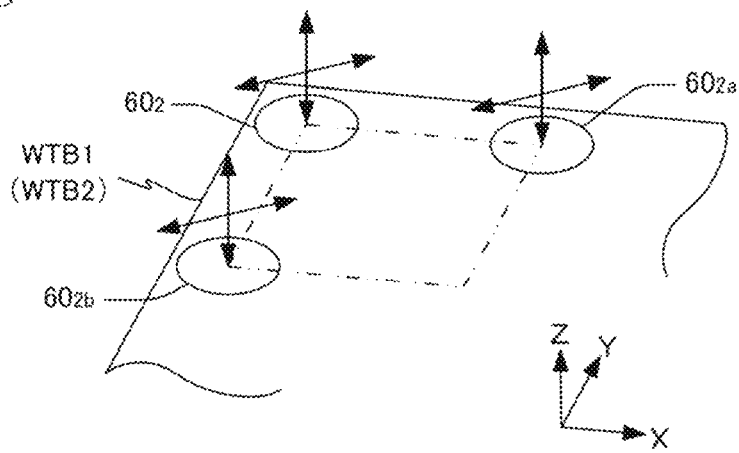
Figure 8C:
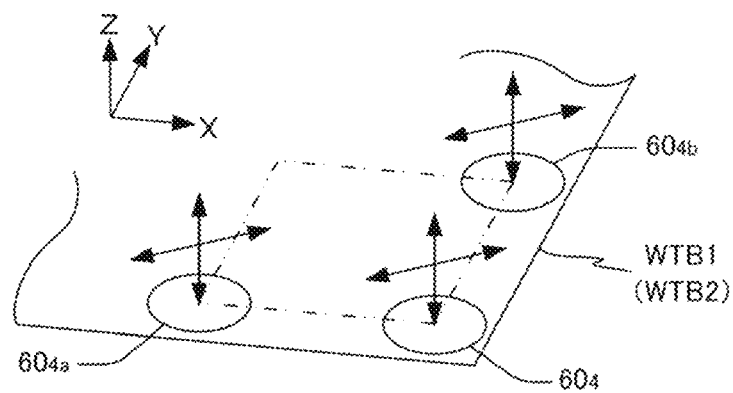

Heads $60_2$, $60_{2a}$, $60_{2b}$ belonging to the second head group $61_2$, as is shown in FIGS. 6 and 8B, are two-dimensional heads whose measurement directions are in a direction of 45 degrees (−135 degrees) with the X-axis as a reference and in the Z-axis direction. Similarly, heads $60_4$, $60_{4a}$, $60_{4b}$ belonging to the fourth head group $61_4$, as is shown in FIGS. 6 and 8C, are two-dimensional heads whose measurement directions are in the direction of 45 degrees (−135 degrees) with the X-axis as a reference and in the Z-axis direction.

Figure 5:
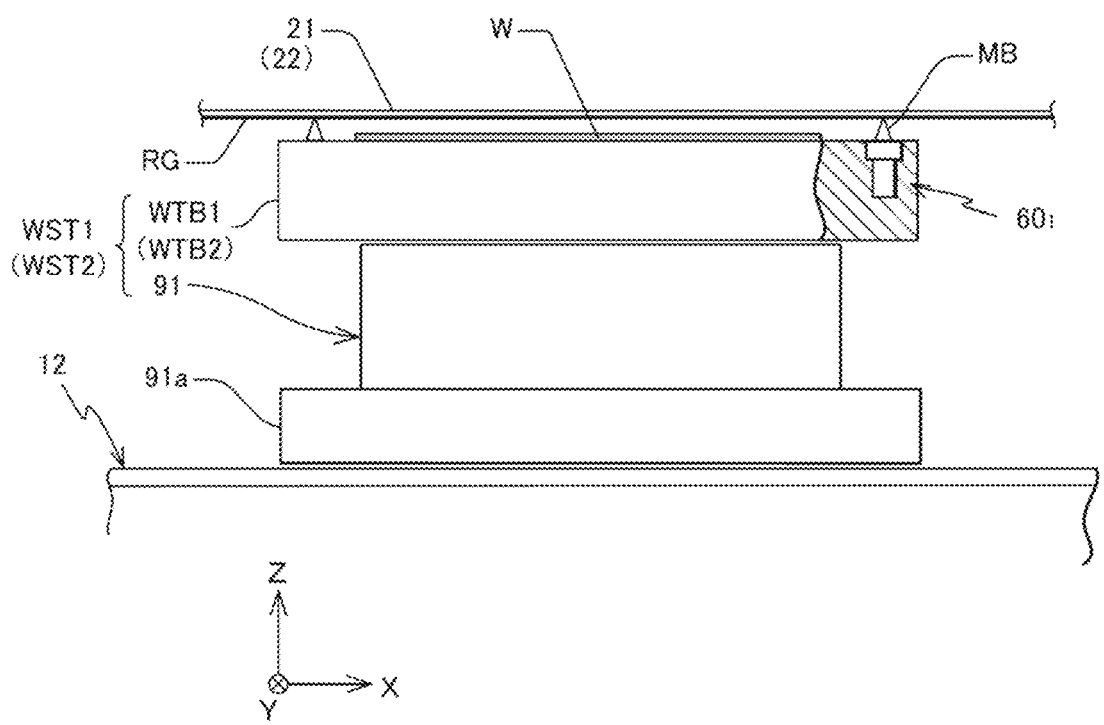
FIG. 5 is an enlarged view of a wafer stage which is partially fragmented.

Heads ($60_1$, $60_{1a}$, $60_{1b}$) belonging to the first head group $61_1$, heads ($60_2$, $60_{2a}$, $60_{2b}$) belonging to the second head group $61_2$, heads ($60_3$, $60_{3a}$, $60_{3b}$) belonging to the third head group $61_3$, and heads ($60_4$, $60_{4a}$, $60_{4b}$) belonging to the fourth head group $61_4$, as is obvious from FIGS. 2 and 5, respectively measure positional information of wafer tables WTB1, WTB2 (wafer stages WST1, WST2) in each measurement direction by respectively irradiating a measurement beam (refer to reference code MB in FIG. 5) on two-dimensional grating RG formed on the surface of sections $21_1$, $21_2$, $21_3$, $21_4$ of scale plate 21, or sections $22_1$, $22_2$, $22_3$, $22_4$ of scale plate 22 opposing the heads, and receiving reflection/diffraction beams from two-dimensional grating RG. Here, as each of the heads $60_1$, $60_{1a}$, $60_{1b}$, $60_2$, $60_{2a}$, $60_{2b}$, $60_3$, $60_{3a}$, $60_{3b}$, $60_4$, $60_{4a}$ and $60_{4b}$, a sensor head having a structure similar to a displacement measurement sensor head disclosed in, for example, U.S. Pat. No. 7,561,280 can be used.

In the respective heads $60_1$, $60_{1a}$, $60_{1b}$, $60_2$, $60_{2a}$, $60_{2b}$, $60_3$, $60_{3a}$, $60_{3b}$, $60_4$, $60_{4a}$ and $60_{4b}$ structured in the manner described above, influence of air fluctuation can be almost ignored because the optical path length of the measurement beam in the air is extremely short. However, in the present embodiment, the light source and the photodetector are provided external to each head, or to be more specific, provided inside (or outside) stage main section 91, and only the optical system is provided inside each head. Then, the light source, the photodetector and the optical system are optically connected via an optical fiber which is not shown. To improve positioning accuracy of wafer table WTB1 (or WTB2), aerial transmission of laser beams and the like can be performed between stage main section 91 and wafer table WTB1 (or WTB2).

When wafer stages WST1, WST2 are positioned within the movement area at the time of exposure previously described, heads $60_1$, $60_{1a}$, $60_{1b}$ belonging to the first head group $61_1$ structure two-dimensional encoders $70_1$, $70_{1a}$, $70_{1b}$, and $71_1$, $71_{1a}$, $71_{1b}$ (refer to FIG. 9) that irradiate measurement beams (measurement light) on (section $21_1$ of) scale plate 21, receive diffraction beams from a grating formed on a surface (lower surface) of scale plate 21 having a periodic direction in a direction of 135 degrees with the X-axis serving as a reference, that is, a direction of −45 degrees with the X-axis serving as a reference (hereinafter appropriately referred to as a −45 degrees direction or an α direction), and measure the position of wafer tables WTB1, WTB2 in the −45 degrees direction (α direction) and the Z-axis direction.

When wafer stages WST1, WST2 are positioned within the movement area at the time of exposure previously described, heads $60_2$, $60_{2a}$, $60_{2b}$ belonging to the second head group $61_2$ structure two-dimensional encoder $70_2$, $70_{2a}$, $70_{2b}$, and $71_2$, $71_{2a}$, $71_{2b}$ (refer to FIG. 9) that irradiate measurement beams (measurement light) on (section $21_2$ of) scale plate 21, receive diffraction beams from a grating formed on a surface (lower surface) of scale plate 21 having a periodic direction in a direction of −135 degrees with the X-axis serving as a reference, that is, a direction of 45 degrees with the X-axis serving as a reference (hereinafter appropriately referred to as a 45 degrees direction or a β direction), and measure the position of wafer tables WTB1, WTB2 in the 45 degrees direction (β direction) and the Z-axis direction.

When wafer stages WST1, WST2 are positioned within the movement area at the time of exposure previously described, heads $60_3$, $60_{3a}$, $60_{3b}$ belonging to the third head group $61_3$ structure two-dimensional encoders $70_3$, $70_{3a}$, $70_{3b}$, and $71_3$, $71_{3a}$, $71_{3b}$ (refer to FIG. 9) that irradiate measurement beams (measurement light) on (section $21_3$ of) scale plate 21, receive diffraction beams from a grating formed on a surface (lower surface) of scale plate 21 having a periodic direction in the −45 degrees direction (α direction), and measure the position of wafer tables WTB1, WTB2 in the −45 degrees direction (α direction) and the Z-axis direction.

When wafer stages WST1, WST2 are positioned within the movement area at the time of exposure previously described, heads $60_4$, $60_{4a}$, $60_{4b}$ belonging to the fourth head group $61_4$ structure two-dimensional encoders $70_4$, $70_{4a}$, $70_{4b}$, and $71_4$, $71_{4a}$, $71_{4b}$ (refer to FIG. 9) that irradiate measurement beams (measurement light) on (section $21_4$ of) scale plate 21, receive diffraction beams from a grating formed on a surface (lower surface) of scale plate 21 having a periodic direction in the 45 degrees direction (β direction), and measure the position of wafer tables WTB1, WTB2 in the 45 degrees direction ((3 direction) and the Z-axis direction.

Further, when wafer stages WST1, WST2 are positioned within the movement area at the time of measurement previously described, heads $60_1$, $60_{1a}$, $60_{1b}$ belonging to the first head group $61_1$ structure two-dimensional encoders $70_1$, $70_{1a}$, $70_{1b}$, and $71_1$, $71_{1a}$, $71_{1b}$ (refer to FIG. 9) that irradiate measurement beams (measurement light) on (section $22_1$ of) scale plate 22, receive diffraction beams from a grating formed on a surface (lower surface) of scale plate 22 having a periodic direction in the −45 degrees direction (α direction), and measure the position of wafer tables WTB1, WTB2 in the −45 degrees direction (α direction) and the Z-axis direction.

When wafer stages WST1, WST2 are positioned within the movement area at the time of measurement previously described, heads $60_2$, $60_{2a}$, $60_{2b}$ belonging to the second head group $61_2$ structure two-dimensional encoders $70_2$, $70_{2a}$, $70_{2b}$, and $71_2$, $71_{2a}$, $71_{2b}$ (refer to FIG. 9) that irradiate measurement beams (measurement light) on (section $22_2$ of) scale plate 22, receive diffraction beams from a grating formed on a surface (lower surface) of scale plate 22 having a periodic direction in the 45 degrees direction (β direction), and measure the position of wafer tables WTB1, WTB2 in the 45 degrees direction ((3 direction) and the Z-axis direction.

When wafer stages WST1, WST2 are positioned within the movement area at the time of measurement previously described, heads $60_3$, $60_{3a}$, $60_{3b}$ belonging to the third head group $61_3$ structure two-dimensional encoders $70_3$, $70_{3a}$, $70_{3b}$, and $71_3$, $71_{3a}$, $71_{3b}$ (refer to FIG. 9) that irradiate measurement beams (measurement light) on (section $22_3$ of) scale plate 22, receive diffraction beams from a grating formed on a surface (lower surface) of scale plate 22 having a periodic direction in the −45 degrees direction (α direction), and measure the position of wafer tables WTB1, WTB2 in the −45 degrees direction (α direction) and the Z-axis direction.

When wafer stages WST1, WST2 are positioned within the movement area at the time of measurement previously described, heads $60_4$, $60_{4a}$, $60_{4b}$ belonging to the fourth head group $61_4$ structure two-dimensional encoders $70_4$, $70_{4a}$, $70_{4b}$, and $71_4$, $71_{4a}$, $71_{4b}$ (refer to FIG. 9) that irradiate measurement beams (measurement light) on (section $22_4$ of) scale plate 22, receive diffraction beams from a grating formed on a surface (lower surface) of scale plate 22 having a periodic direction in the 45 degrees direction (β direction), and measure the position of wafer tables WTB1, WTB2 in the 45 degrees direction ((3 direction) and the Z-axis direction.

As it can be seen from the description above, in the present embodiment, regardless of irradiating the measurement beam (measurement light) on either one of scale plates 21, 22, or in other words, regardless of the area where wafer stages WST1, WST2 are located either within the movement area at the time of exposure or the movement area at the time of measurement previously described, heads $60_1$, $60_{1a}$, $60_{1b}$, $60_2$, $60_{2a}$, $60_{2b}$, $60_3$, $60_{3a}$, $60_{3b}$, $60_4$, $60_{4a}$ and $60_{4b}$ on wafer stage WST1 structure two-dimensional encoders $70_1$, $70_{1a}$, $70_{1b}$, $70_2$, $70_{2a}$, $70_{2b}$, $70_3$, $70_{3a}$, $70_{3b}$, $70_4$, $70_{4a}$, $70_{4b}$, respectively, along with the scale plates on which the measurement beam (measurement light) is irradiated, and heads $60_1$, $60_{1a}$, $60_{1b}$, $60_2$, $60_{2a}$, $60_{2b}$, $60_3$, $60_{3a}$, $60_{3b}$, $60_4$, $60_{4a}$ and $60_{4b}$ on wafer stage WST2 structure two-dimensional encoders $71_k$, $71_{1a}$, $71_{1b}$, $71_2$, $71_{2a}$, $71_{2b}$, $71_3$, $71_{3a}$, $71_{3b}$, $71_4$, $71_{4a}$, $71_{4b}$, respectively, along with the scale plates on which the measurement beam (measurement light) is irradiated.

Measurement values of the two-dimensional encoders (hereinafter shortly referred to as an encoder as appropriate) $70_1$, $70_{1a}$, $70_{1b}$, $70_2$, $70_{2a}$, $70_{2b}$, $70_3$, $70_{3a}$, $70_{3b}$, $70_4$, $70_{4a}$, $70_{4b}$, $71_1$, $71_{1a}$, $71_{1b}$, $71_2$, $71_{2a}$, $71_{2b}$, $71_3$, $71_{3a}$, $71_{3b}$, $71_4$, $71_{4a}$, $71_{4b}$ are each supplied to main controller 20 (refer to FIG. 9). Of encoders $70_1$ to $70_4$ or encoders $71_1$ to $71_4$, main controller 20 obtains positional information of wafer tables WTB1, WTB2 in directions of six degrees of freedom (X, Y, Z, θx, θy, θz) within the movement area at the time of exposure including the area directly below projection optical system PL, based on the measurement values of at least three encoders (that is, at least three encoders that output effective measurement values) that face lower surface of (sections $21_1$ to $21_4$ which structure) scale plate 21 on which two-dimensional grating RG is formed.

Main controller 20 performs calibration (to be described later on) of a grid (grid error) of a coordinate system at the time of exposure that corresponds to a variation of two-dimensional grating RG of scale plate 21 while wafer tables WTB1, WTB2 move within the movement area at the time of exposure including, for example, when exposure is being performed, using the measurement values of all of the heads in at least the three groups to which the heads of at least the three encoders belong used for measuring the positional information of wafer tables WTB1, WTB2 in directions of six degrees of freedom (X, Y, Z, θx, θy, θz).

Similarly, of encoders $70_1$ to $70_4$ or encoders $71_1$ to $71_4$, main controller 20 obtains positional information of wafer tables WTB1, WTB2 in directions of six degrees of freedom (X, Y, Z, θx, θy, θz) within the movement area at the time of measurement including the area directly below alignment system ALG, based on the measurement values of at least three encoders (that is, at least three encoders that output effective measurement values) that face the lower surface of (sections $22_1$ to $22_4$ which structure) scale plate 22 on which two-dimensional grating RG is formed.

Main controller 20 can perform calibration (to be described later on) of a grid (grid error) of a coordinate system at the time of measurement that corresponds to a variation of two-dimensional grating RG of scale plate 22 while wafer tables WTB1, WTB2 move within the movement area at the time of measurement, including, for example, when alignment is being performed, using the measurement values of all of the heads in at least the three groups to which the heads of at least the three encoders belong used for measuring the positional information of wafer tables WTB1, WTB2 in directions of six degrees of freedom (X, Y, Z, θx, θy, θz).

Further, in exposure apparatus 100 of the present embodiment, the position of wafer stages WST1, WST2 (wafer tables WTB1, WTB2) can be measured by wafer interferometer system 18 (refer to FIG. 9), independently from encoder systems 70, 71. The measurement values of wafer interferometer system 18 are used secondarily, for example, as a backup and the like at the time of output abnormalities of encoder systems 70, 71. Incidentally, details on wafer interferometer system 18 are omitted.

Alignment system ALG, as is shown in FIG. 1, is an alignment system of an off-axis method that is placed in a predetermined spacing on the +X side of projection optical system PL. In the present embodiment, as alignment system ALG, as an example, an FIA (Field Image Alignment) system is used which is a type of an alignment sensor of an image-processing method that measures a mark position by illuminating a mark with a broadband (wideband) light such as a halogen lamp and the like, and performing image-processing on this mark image. Imaging signals from alignment system ALG are supplied to main controller 20 (refer to FIG. 9), via an alignment signal processing system which is not shown.

Incidentally, alignment system ALG is not limited to the FIA system, and for example, it is a matter of course that an alignment sensor which performs detection by irradiating a coherent detection light on a mark and detecting scattered light or diffracted light generated from the mark, or by making two diffracted lights (for example, diffracted light of the same order or diffracted light diffracting in the same direction) generated from the mark interfere with each other can be used alone, or appropriately combined. As alignment system ALG, an alignment system that has a plurality of detection areas as in the one disclosed in, for example, U.S. Patent Application Publication No. 2008/0088843 and the like can be employed.

Other than this, in exposure apparatus 100 of the present embodiment, a multi-point focal point detection system of an oblique incidence method (hereinafter, shortly described as multi-point AF system) AF (not shown in FIG. 1, refer to FIG. 9) is provided placed at the measurement station along with alignment system ALG and having a structure similar to the one disclosed in, for example, U.S. Pat. No. 5,448,332 and the like. At least a part of a measurement operation by multi-point AF system AF is performed concurrently with the mark detection operation by alignment system ALG, and positional information of the wafer table is measured by the encoder system previously described during the measurement operation. Detection signals of multi-point AF system AF is supplied to main controller 20 (refer to FIG. 9), via an AF signal processing system (not shown). Main controller 20 detects positional information (height difference information/unevenness information) of the wafer W surface in the Z-axis direction, based on the detection signals of multi-point AF system AF and the measurement information of the encoder system previously described, and performs a so-called focus/leveling control of wafer W during scanning exposure in the exposure operation based on the information detected beforehand and the measurement information of the encoder system previously described (positional information in the Z-axis, the θx and the θy directions). Incidentally, the multi-point AF system can be provided at the vicinity of projection unit PU within exposure station, and focus/leveling control of wafer W may be performed driving the wafer table while measuring the positional information (unevenness information) of the wafer surface at the time of the exposure operation.

In exposure apparatus 100, furthermore, a pair of reticle alignment systems 13A, 13B (not shown in FIG. 1, refer to FIG. 9) of a TTR (Through The Reticle) method which uses light of the exposure wavelength as is disclosed in, for example, U.S. Pat. No. 5,646,413 and the like, is provided above reticle R. Detection signals of reticle alignment systems 13A, 13B are supplied to main controller 20, via an alignment signal processing system which is not shown. Incidentally, instead of the reticle alignment system, reticle alignment can be performed using the aerial image measuring instrument which is not shown provided on wafer stage WST.

FIG. 9 shows a block diagram which is partly omitted of a control system related to stage control of exposure apparatus 100. This control system is structured centering on main controller 20. Main controller 20 includes a so-called microcomputer (or a workstation) consisting of a CPU (Central Processing Unit), a ROM (Read Only Memory), a RAM (Random Access Memory) and the like that has overall control of the entire device.

In exposure apparatus 100 structured in the manner described above, when manufacturing a device, one of wafer stages WST1, WST2 on which the wafer is loaded is moved within the measurement station (movement area at the time of measurement) by main controller 20, and wafer measurement operation is performed by alignment system ALG and multi-point AF system. That is, to wafer W held by one of wafer stages WST1, WST2 within the movement area at the time of measurement, mark detection using alignment system ALG, or a so-called wafer alignment (such as Enhanced Global Alignment (EGA) disclosed in, for example, U.S. Pat. No. 4,780,617 and the like) and measurement of surface information (height difference/unevenness information) of the wafer using the multi-point AF system are performed. On this operation, by encoder system 70 (encoders $70_1$ to $70_4$) or encoder system 71 (encoders $71_1$ to $71_4$), positional information of wafer tables WTB1, WTB2 in directions of six degrees of freedom (X, Y, Z, θx, θy, θz) is obtained (measured). Incidentally, before beginning or after completing the wafer alignment, position of the second reference mark on the reference mark member provided on one of wafer stages WST1, WST2 is measured by main controller 20 using alignment system ALG. Then, array coordinates of a plurality of shot areas on wafer W calculated as results of wafer alignment are replaced with array coordinates using the second reference mark as a reference.

After the measurement operation such as wafer alignment, one of the wafer stages (WST1 or WST2) moves to the movement area at the time of exposure, and by main controller 20, reticle alignment and the like to obtain a positional relation between a projection center of the reticle pattern and the center of the pair of the first reference marks is performed, using reticle alignment systems 13A, 13B, reference mark members (not shown) on the wafer table (WTB1 or WTB2) and the like in a procedure similar to a normal scanning stepper.

Then, by main controller 20, based on the results of the reticle alignment and the array coordinates of the plurality of shot areas using the second reference marks obtained as a result of the wafer alignment as a reference, exposure operation by the step-and-scan method is performed, and the pattern of reticle R is transferred, respectively, onto a plurality of shot areas on wafer W. The exposure operation by the step-and-scan method is performed by alternately repeating a scanning exposure operation in which synchronous movement of reticle stage RST and wafer stage WST1 or WST2 is performed, and a movement (stepping) operation between shots in which wafer stage WST1 or WST2 is moved to an acceleration starting position for exposure of a shot area. At the time of the exposure operation, positional information in directions of six degrees of freedom (X, Y, Z, θx, θy, θz) of one of the wafer tables (WTB1 or WTB2) is obtained (measured) by encoder system 70 (encoders $70_1$ to $70_4$) or encoder system 71 (encoders $71_1$ to $71_4$).

Further, exposure apparatus 100 of the present embodiment is equipped with the two wafer stages WST1, WST2. Therefore, concurrently with performing exposure by the step-and-scan method on the wafer loaded on one of wafer stages, for example, wafer stage WST1, a concurrent processing operation is performed in which wafer alignment and the like is performed on the wafer mounted on the other wafer stage WST2.

In exposure apparatus 100 of the present embodiment, as is previously described, main controller 20 obtains (measures) positional information of wafer table WTB1 in directions of six degrees of freedom (X, Y, Z, θx, θy, θz) using encoder system 70 (refer to FIG. 9) in both the movement area at the time of exposure and the movement area at the time of measurement. Further, main controller 20 obtains (measures) positional information of wafer table WTB2 in directions of six degrees of freedom (X, Y, Z, θx, θy, θz) using encoder system 71 (refer to FIG. 9) in both the movement area at the time of exposure and the movement area at the time of measurement.

Here, a principle and the like of position measurement in directions of three degrees of freedom (the X-axis direction, the Y-axis direction and the θz direction, also shortened to (X, Y, θz))) within the XY plane by encoder systems 70, 71 will be further described. Here, measurement values of encoder heads $60_1$ to $60_4$ or encoders $70_1$ to $70_4$ mean measurement values in a measurement direction which is not in the Z-axis direction of encoder heads $60_1$ to $60_4$ or encoders $70_1$ to $70_4$.

In the present embodiment, by employing the structure and placement of encoder heads $60_1$ to $60_4$ and scale plate 21 previously described, within the movement area at the time of exposure at least three of encoder heads $60_1$ to $60_4$ constantly faces (the corresponding sections $21_1$ to $21_4$ of) scale plate 21.

Figure 10:
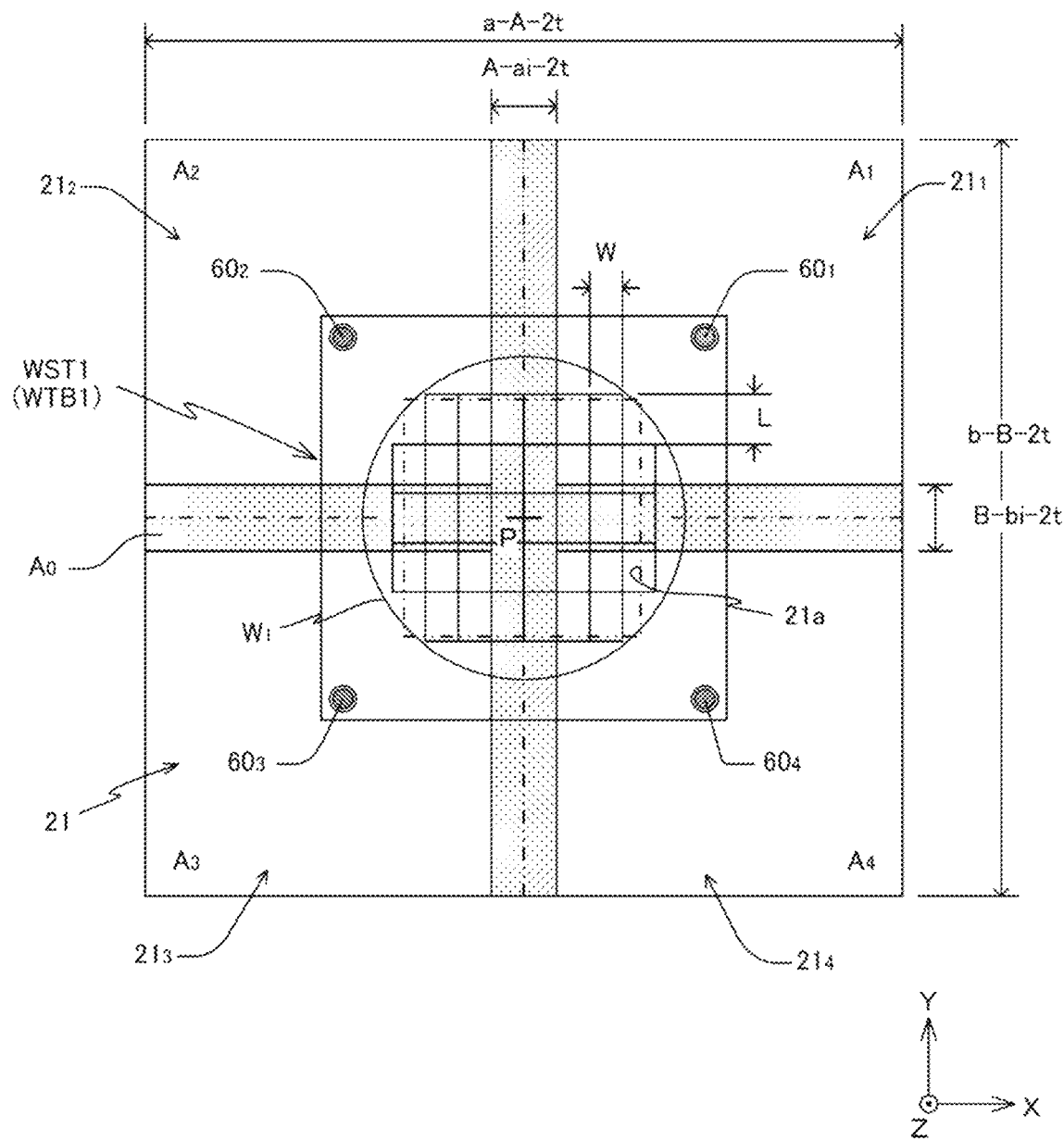
FIG. 10 is a view that shows a relation between a placement of encoder heads and scale plates and measurement areas of an encoder system.

FIG. 10 shows a relation between a placement of encoder heads $60_1$ to $60_4$ and each section $21_1$ to $21_4$ of scale plate 21 on wafer stage WST1 and measurement areas $A_0$ to $A_4$ of encoder system 70. FIG. 10 shows only heads $60_1$, $60_2$, $60_3$, and $60_4$ which are used for measuring positional information in directions of six degrees of freedom of wafer table WTB1. Incidentally, because wafer stage WST2 is structured similarly to wafer stage WST1, the description here will be made only for wafer stage WST1.

In the case the center of wafer table WTB1 (coincides with the center of the wafer) is positioned within a first area $A_1$ which is within the movement area at the time of exposure that is also an area located on the +X side and on the +Y side with respect to exposure center (the center of exposure area IA) P (an area within the first quadrant (however, excluding an area $A_0$) whose origin point is exposure center P), heads $60_4$, $60_1$, $60_2$ on wafer stage WST1 face sections $21_4$, $21_1$, $21_2$ of scale plate 21, respectively. In the first area $A_1$, effective measurement values are sent to main controller 20 from heads $60_4$, $60_1$, $60_2$ (encoders $70_4$, $70_1$, $70_2$). Incidentally, the position of wafer stages WST1, WST2 in the description below means the position in the center of the wafer stage (coincides with the center of wafer table and the center of the wafer, respectively). That is, instead of using the expression, the position in the center of wafer stages WST1, WST2, the expression used will be, the position of wafer stages WST1, WST2.

Similarly, in the case wafer stage WST1 is positioned within a second area $A_2$ which is within the movement area at the time of exposure that is also an area located on the −X side and on the +Y side with respect to exposure center P (an area within the second quadrant (however, excluding area $A_0$) whose origin point is exposure center P), heads $60_1$, $60_2$, $60_3$ face sections $21_1$, $21_2$, $21_3$ of scale plate 21, respectively. In the case wafer stage WST1 is positioned within a third area $A_3$ which is within the movement area at the time of exposure that is also an area located on the −X side and on the −Y side with respect to exposure center P (an area within the third quadrant (however, excluding area $A_0$) whose origin point is exposure center P), heads $60_2$, $60_3$, $60_4$ face sections $21_2$, $21_3$, $21_4$ of scale plate 21, respectively. In the case wafer stage WST1 is positioned within a fourth area $A_4$ which is within the movement area at the time of exposure that is also an area located on the +X side and the −Y side with respect to exposure center P (an area within the fourth quadrant (however, excluding area $A_0$) whose origin point is exposure center P), heads $60_3$, $60_4$, $60_1$ face sections $21_3$, $21_4$, $21_1$ of scale plate 21, respectively.

In the present embodiment, as is shown in FIG. 10, in the case wafer stage WST1 is positioned within a cross-shaped area $A_0$ (an area that passes through exposure center P including an area of a width A−ai−2t having a longitudinal direction in the Y-axis direction and an area of a width B−bi−2t having a longitudinal direction in the X-axis direction (hereinafter called a zero$^{th}$ area)), the four heads $60_1$ to $60_4$ on wafer stage WST1 face (the corresponding sections $21_1$ to $21_4$) of scale plate 21. Accordingly, within zero$^{th}$ area $A_0$, effective measurement values are sent from heads $60_1$ to $60_4$ (encoders $70_1$ to $70_4$) to main controller 20. Incidentally, in the present embodiment, adding to the above conditions (A≥ai+2t, B≥bi+2t), conditions A≥ai+W+2t, B≥bi+L+2t can be added, taking into consideration the size (W, L) of the shot area on the wafer where the pattern is formed. Here, W is the width in the X-axis direction and L is the length in the Y-axis direction of the shot area, respectively. W equals a distance of the scanning exposure section and L equals a stepping distance in the X-axis direction, respectively.

Main controller 20, based on the measurement values of heads $60_1$ to $60_4$ (encoders $70_1$ to $70_4$), calculates a position (X, Y, θz) within the XY plane of wafer stage WST1. Here, the measurement values of encoders $70_1$ to $70_4$ (expressed as $C_1$ to $C_4$, respectively) are dependent on the position (X, Y, θz) of wafer stage WST1, as in the following formulas (1) to (4).

$$C_1 = -(\cos \theta z + \sin \theta z)X/\sqrt{2} + (\cos \theta z - \sin \theta z)Y/\sqrt{2} + \sqrt{2}p \sin \theta z \quad (1)$$

$$C_2 = -(\cos \theta z - \sin \theta z)X/\sqrt{2} - (\cos \theta z + \sin \theta z)Y/\sqrt{2} + \sqrt{2}p \sin \theta z \quad (2)$$

$$C_3 = (\cos \theta z + \sin \theta z)X/\sqrt{2} - (\cos \theta z - \sin \theta z)Y/\sqrt{2} + \sqrt{2}p \sin \theta z \quad (3)$$

$$C_4 = (\cos \theta z - \sin \theta z)X/\sqrt{2} + (\cos \theta z + \sin \theta z)Y/\sqrt{2} + \sqrt{2}p \sin \theta z \quad (4)$$

However, p, as is shown in FIG. 6, is the distance in the X-axis and the Y-axis direction of each of the heads $60_1$ to $60_4$ from the center of wafer table WTB1 (WTB2).

Main controller 20 calculates the position (X, Y, θz) within the XY plane of wafer stage WST1 by specifying three heads (encoders) that face scale plate 21 corresponding to areas $A_0$ to $A_4$ in which wafer stage WST1 is positioned, forming simultaneous equations by choosing formulas that the measurement values of these heads follow from formulas (1) to (4) above, and solving the simultaneous equations using the measurement values of the three heads (encoders). For example, in the case wafer stage WST1 is positioned within the first area $A_1$, main controller 20 forms simultaneous equations from formulas (1), (2) and (4) that the measurement values of heads $60_1$, $60_2$, $60_4$ (encoders $70_1$, $70_2$, $70_4$) follow, and solves the simultaneous equations by substituting the measurement values of each head into the left side of formulas (1), (2), and (4), respectively.

Incidentally, in the case wafer stage WST1 is positioned within zero$^{th}$ area $A_0$, main controller 20 can select three arbitrary heads from heads $60_1$ to $60_4$ (encoder $70_1$ to $70_4$). For example, after wafer stage WST1 has moved to the zero$^{th}$ area from the first area, heads $60_1$, $60_2$, $60_4$ (encoders $70_1$, $70_2$, $70_4$) corresponding to the first area should be selected.

Main controller 20 drives (performs position control of) wafer stage WST1 within the movement area at the time of exposure, based on results of the calculation (X, Y, θz) described above.

In the case wafer stage WST1 is positioned within the movement area at the time of measurement, main controller 20 measures positional information in directions of three degrees of freedom (X, Y, θz), using encoder system 70 (encoders $70_1$ to $70_4$). Here, the measurement principle and the like are the same as the case previously described when wafer stage WST1 is positioned within the movement area at the time of exposure, except for the point that exposure center P is replaced with the detection center of alignment system ALG and (sections $21_1$ to $21_4$ of) scale plate 21 is replaced with (sections $22_1$ to $22_4$ of) scale plate 22.

Furthermore, main controller 20 uses three heads of heads $60_1$ to $60_4$ facing scale plates 21, 22 while switching to three heads with at least one different, according to the position of wafer stages WST1, WST2. Here, on switching the encoder heads, a joint processing is performed to assure continuity of the measurement values of the position of the wafer stage, as is disclosed in, for example, U.S. Patent Application Publication No. 2008/0094592 and the like. Further, in the present embodiment, in a method similar to the method disclosed in, for example, U.S. Patent Application Publication No. 2011/0053061, switching between heads $60_1$ to $60_4$ at the time of exposure operation by the step-and-scan method and joint processing are performed.

Next, the principle and the like for position measurement in directions of three degrees of freedom (Z, θx, θy) by encoder systems 70, 71 will be described furthermore. Here, measurement values of encoder heads $60_1$ to $60_4$ or encoders $70_1$ to $70_4$ mean measurement values in the Z-axis direction of encoder heads $60_1$ to $60_4$ or encoders $70_1$ to $70_4$.

In the present embodiment, by employing the structure and the placement of encoder heads $60_1$ to $60_4$ and scale plate 21 previously described, within the movement area at the time of exposure, at least three of encoder heads $60_1$ to $60_4$ face (the corresponding sections $21_1$ to $21_4$ of) scale plate 21, corresponding to areas $A_0$ to $A_4$ in which wafer stage WST1 (WST2) is positioned. Effective measurement values from the heads (encoders) facing scale plate 21 is sent to main controller 20.

Main controller 20 calculates a position (Z, θx, θy) of wafer stages WST1 (WST2), based on the measurement values of encoders $70_1$ to $70_4$. Here, measurement values in the Z-axis direction (expressed as $D_1$ to $D_4$, respectively, to distinguish them from measurement values $C_1$ to $C_4$ in the measurement direction which is not the Z-axis direction previously described, that is, an uniaxial direction within the XY plane) of encoders $70_1$ to $70_4$ are dependent on the position (Z, θx, θy) of wafer stage WST1 (WST2), as in the following formulas (5) to (8).

$$D_1 = -p \tan θy + p \tan θx + Z \quad (5)$$

$$D_2 = p \tan θy + p \tan θx + Z \quad (6)$$

$$D_3 = p \tan θy - p \tan θx + Z \quad (7)$$

$$D_4 = -p \tan θy - p \tan θx + Z \quad (8)$$

However, p is a distance (refer to FIG. 6) of heads $60_1$ to $60_4$ in the X-axis and the Y-axis direction, from the center of wafer table WTB1 (WTB2).

Main controller 20 calculates the position (Z, θx, θy) of wafer stage WST1 (WST2) by choosing formulas that the measurement values of three heads (encoders) follow from formulas (5) to (8) corresponding to areas $A_0$ to $A_4$ in which wafer stage WST1 (WST2) is positioned, and by substituting the measurement values of the three heads (encoders) into simultaneous equations structured from the three chosen formulas and solving the simultaneous equations. For example, in the case wafer stage WST1 (or WST2) is positioned within the first area $A_1$, main controller 20 forms simultaneous equations from formulas (5), (6), and (8) that the measurement values of heads $60_1$, $60_2$, $60_4$ (encoders $70_1$, $70_2$, $70_4$) (or heads $60_2$, $60_2$, $60_4$ (encoders $71_2$, $71_2$, $71_4$) follow, and solves the equations by substituting the measurement values into the left side of formulas (5), (6), and (8), respectively.

Incidentally, in the case wafer stage WST1 (or WST2) is positioned within zero$^{th}$ area $A_0$, three arbitrary heads can be selected from heads $60_1$ to $60_4$ (encoders $70_1$ to $70_4$) (or heads $60_1$ to $60_4$ (encoders $71_1$ to $71_4$)), and the simultaneous equations formed from the equations that the measurement values of the chosen three heads follow can be used.

Main controller 20 performs focus/leveling control on wafer stage WST1 (or WST2) within the movement area at the time of exposure, based on the calculation results (Z, θx, θy) above and the height difference information (focus mapping data) previously described.

In the case wafer stage WST1 (or WST2) is positioned within the movement area at the time of measurement, main controller 20 measures positional information in directions of three degrees of freedom (Z, θx, θy), using encoder system 70 or 71. Here, the measurement principle and the like is similar to the case when wafer stage WST1 is positioned within the movement area at the time of exposure, except for the point that the exposure center is replaced with the detection center of alignment system ALG and that (sections $21_1$ to $21_4$ of) scale plate 21 is replaced with (sections $22_1$ to $22_4$ of) scale plate 22. Main controller 20 performs focus/leveling control on wafer stage WST1 or WST2, based on measurement values of encoder system 70 or 71. Incidentally, in the movement area at the time of measurement (measurement station), focus/leveling does not necessarily have to be performed. That is, acquisition of mark position and height difference information (focus mapping data) should be performed, and by subtracting the Z tilt at the time of acquisition (at the time of measurement) of the wafer stage height difference information from the height difference information, height difference information of a reference surface of the wafer stage, such as for example, the upper surface serving as a reference, should be obtained. Then, at the time of exposure, focus/leveling becomes possible, based on this height difference information and positional information in directions of three degrees of freedom (Z, θx, θy) (of the reference surface) of the wafer stage.

Furthermore, main controller 20 uses three heads of heads $60_1$ to $60_4$ facing scale plates 21, 22 while switching to three heads with at least one different, according to the position of wafer stages WST1, WST2. Here, on switching the encoder heads, the joint processing as is previously described is performed to secure continuity of the measurement values of the position of wafer stage WST1 (or WST2).

Next, correction (calibration) of grid variation quantity of the coordinate system at the time of exposure in exposure apparatus 100 related to the present embodiment is described, which is performed while the series of sequences described above is performed. Here, the case will be described when wafer stage WST1 moves in the movement area at the time of exposure.

This correction (calibration) of the grid variation quantity is performed by main controller 20, concurrently with the position control of wafer table WTB1 in directions of six degrees of freedom which is performed based on the measurement values of the three encoders chosen from encoders $70_1$ to $70_4$ as is previously described.

Main controller 20, for example, takes in the measurement values in an a direction of heads $60_1$, $60_{1a}$, (encoders $70_1$, $70_{1a}$) and sequentially integrates difference data which is expressed in formula (9) below, that is, deviation Δα/δx corresponding to the X position of the grid in the α direction (α grid), each time wafer stage WST1 moves by Δx in the X-axis direction in a state, for example, where heads $60_1$, $60_{1a}$, $60_{1b}$ belonging to the first head group $61_1$ are facing the corresponding section $21_1$ of scale plate 21, for example, during exposure and the like. This allows a discrete distribution of the α grid variation quantity in the X-axis direction to be obtained.

$$Δα/δx = ζ_1(x - Δx, y) - ζ_1(x, y) \quad (9)$$

Further, main controller 20, for example, takes in the measurement values in the α direction of heads $60_1$, $60_{1b}$, (encoders $70_1$, $70_{1b}$) and sequentially integrates difference data which is expressed in formula (10) below, that is, deviation Δα/δy corresponding to the Y position of the α grid, each time wafer table WTB1 moves by Δy in the Y-axis direction in a state, for example, where heads $60_1$, $60_{1a}$, $60_{1b}$ belonging to the first head group $61_1$ are facing the corresponding section $21_1$ of scale plate 21, for example, during exposure and the like. This allows a discrete distribution of the α grid variation quantity in the Y-axis direction to be obtained.

$$Δα/δy = ζ_1(x, y - Δy) - ζ_1(x, y) \quad (10)$$

Main controller 20 can obtain an α correction map for correcting a drift (α grid variation) generated in the first quadrant section (the first section $21_1$ of scale plate 21) of two-dimensional grating RG expressed as a function $ζ_1$ (x, y), from the discrete distribution of the α grid variation quantity in the X-axis direction described above and the discrete distribution of the α grid variation quantity in the Y-axis direction.

Main controller 20 takes in measurement values in the α direction, for example, of heads $60_3$, $60_{3a}$ (encoders $70_3$, $70_{3a}$) and sequentially integrates difference data similar to formula (9), each time wafer stage WST1 moves by Δx in the X-axis direction in a state, for example, where heads $60_3$, $60_{3a}$, $60_{3b}$ belonging to the third head group $61_3$ face the corresponding section $21_3$ of scale plate 21, for example, during exposure and the like, along with taking in measurement values in the α direction, for example, of heads $60_3$, $60_{3b}$ ($70_3$, $70_{3b}$) and sequentially integrates difference data similar to formula (10), each time wafer stage WST1 moves by Δy in the Y-axis direction. Then, main controller 20 obtains the α correction map for correcting the drift (α grid variation) generated in the third quadrant section (the third section $21_3$ of scale plate 21) of two-dimensional grating RG expressed as a function ($\zeta_3$ (x, y)), from the discrete distribution of the α grid variation quantity in the X-axis direction and the discrete distribution of the α grid variation quantity in the Y-axis direction that are obtained from the integration of the difference data described above.

Main controller 20 takes in measurement values in a β direction, for example, of heads $60_2$, $60_{2a}$ (encoders $70_2$, $70_{2a}$) and sequentially integrates difference data expressed in formula (11) below, each time wafer stage WST1 moves by Δx in the X-axis direction in a state, for example, where heads $60_2$, $60_{2a}$, $60_{2b}$ belonging to the second head group $61_2$ are facing the corresponding section $21_2$ of scale plate 21, for example, during exposure and the like, along with taking in measurement values in the β direction, for example, of heads $60_2$, $60_{2b}$ ($70_2$, $70_{2b}$) and sequentially integrates difference data expressed in formula (12) below, each time wafer stage WST1 moves by Δy in the Y-axis direction. Then, main controller 20 obtains a β correction map for correcting a drift (β grid variation) generated in the second quadrant section (the second section $21_2$ of scale plate 21) of two-dimensional grating RG expressed as a function $\zeta_2$ (x, y), from the discrete distribution of the β grid variation quantity in the X-axis direction and the discrete distribution of the β grid variation quantity in the Y-axis direction that are obtained from the integration of the difference data described above.

$$\Delta\beta/\delta x = \zeta_2(x-\Delta x, y) - \zeta_2(x,y) \quad (11)$$

$$\Delta\beta/\delta y = \zeta_2(x, y-\Delta y) - \zeta_2(x,y) \quad (12)$$

Main controller 20 takes in measurement values in the β direction, for example, of heads $60_4$, $60_{4a}$ (encoders $70_4$, $70_{4a}$) and sequentially integrates difference data similar to formula (11), each time wafer stage WST1 moves by Δx in the X-axis direction in a state, for example, where heads $60_4$, $60_{4a}$, $60_{4b}$ belonging to the fourth head group $61_4$ are facing the corresponding section $21_4$ of scale plate 21, for example, during exposure and the like, along with taking in measurement values in the β direction, for example, of heads $60_4$, $60_{4b}$ ($70_4$, $70_{4b}$) and sequentially integrates difference data similar to formula (12), each time wafer stage WST1 moves by Δy in the Y-axis direction. Then, main controller 20 obtains the β correction map for correcting a drift (β grid variation) generated in the fourth quadrant section (the fourth section $21_4$ of scale plate 21) of two-dimensional grating RG expressed as a function ($\zeta_4$ (x, y)), from the discrete distribution of the β grid variation quantity in the X-axis direction and the discrete distribution of the β grid variation quantity in the Y-axis direction that are obtained from the integration of the difference data described above.

Main controller 20 also makes a Z correction map in a similar manner as the α correction map and the β correction map described above, for example, during exposure and the like.

That is, main controller 20, takes in measurement values in the Z-axis direction, for example, of heads $60_1$, $60_{1a}$ (encoders $70_1$, $70_{1a}$) and sequentially integrates the difference data expressed in formula (13) below, each time wafer stage WST1 moves by Δx in the X-axis direction in a state, for example, where heads $60_1$, $60_{1a}$, $60_{1b}$ belonging to the first head group $61_1$ are facing the corresponding section $21_1$, for example, during exposure and the like, along with taking in measurement values in the Z-axis direction, for example, of heads $60_1$, $60_{1b}$ ($70_1$, $70_{1b}$) and sequentially integrates difference data expressed in formula (14) below, each time wafer stage WST1 moves by Δy in the Y-axis direction. Then, main controller 20 obtains the Z correction map for correcting a Z grid variation (drift) generated in the first quadrant section (the first section $21_1$ of scale plate 21) of two-dimensional grating RG expressed as a function $\eta_1$ (x, y), from the discrete distribution of the Z grid variation quantity in the X-axis direction and the discrete distribution of the Z grid variation quantity in the Y-axis direction that are obtained from the integration of the difference data described above.

$$\Delta Z/\delta x = \eta_1(x-\Delta x, y) - \eta_1(x,y) \quad (13)$$

$$\Delta Z/\delta y = \eta_1(x, y-\Delta y) - \eta_1(x,y) \quad (14)$$

Main controller 20 takes in and performs integration of the difference data in a manner similar to the description above, each time wafer stage WST1 moves by Δx and moves by Δy, also for heads belonging to the second head group, the third head group and the fourth head group in a state facing scale plate 21, for example, during exposure and the like, and obtains the Z correction map, along with reproducing functions ($\eta_2$ (x, y), $\eta_3$ (x, y), $\eta_4$ (x, y), respectively) that express the drift shape (Z grid variation).

Main controller 20 repeatedly performs the difference measurement described above, concurrently with the position measurement in directions of six degrees of freedom of wafer table WTB described above, and performs an update of grid errors of the coordinate system of encoder system 70. Hereinafter, this update of grid errors will also be called refreshing of the coordinate system of encoder system 70.

As is previously described, main controller 20 uses three of heads $60_1$ to $60_4$ facing scale plate 21, switching to three with at least one different according to the position of wafer stage WST1, for example, at the time of exposure. That is, main controller 20 drives wafer table WTB1 based on the positional information of wafer table WTB1 obtained by three of heads $60_1$ to $60_4$ (three of encoders $70_1$ to $70_4$), along with switching at least one of the three heads used for calculating the positional information of wafer table WTB1 according to the position of wafer table WTB1 to a head belonging to another head group which is not used for calculating the positional information of wafer table WTB1. Main controller 20, with this switching, switches the head group subject to taking in the difference data for calibration of the grid errors of two-dimensional grating RG of scale plate 21 described above to another head group. In the present embodiment, simultaneously with the switching of the head used for position measurement of wafer table WTB, switching of redundant heads used for difference measurement previously described is performed.

Main controller 20 performs refreshing of the coordinate system of encoder system 71 similarly to the description above in the case wafer stage WST2 is moving in the movement area at the time of exposure, including the time of exposure.

Now, during exposure, because movement of wafer stages WST1, WST2 is performed according to a shot map and wafer stages WST1, WST2 pass only limited areas, difference data that can be acquired is little. Therefore, main controller 20, on the refreshing of the coordinate systems of encoder systems 70, 71 described above, corrects in a real-time manner a primary component which is a low-order component of grid variation from the integration of difference data, such as, for example, only scaling ($\alpha$, $\beta$ grids), and bending (Z grid), as is previously described.

Then, the integration value of the difference data is monitored, and in the case variation quantity (correction quantity) of the low-order component (primary component) becomes larger than a first quantity defined beforehand, a more elaborate correction is to be performed. Here, a more elaborate correction means, for example, to perform acquisition of difference data previously described by moving wafer stages WST1, WST2 in almost the entire area of their effective strokes to acquire more difference data, and based on the more acquired difference data, to perform grid variation quantity (error) correction similar to the one previously described, or variation quantity correction of $\alpha$, $\beta$ and Z grids subject to at least a secondary component which is performed in a method similar to the following description in a wider range of two-dimensional grating RG of scale plate 21.

In the case variation quantity (correction quantity) of the low-order component (primary component) is larger than a second amount defined beforehand which is larger than the first quantity, main controller 20 gives notice to an operator, for example, by display and the like, informing that correction subject to components of a higher order is required. In response to this notice, in the case correction of a higher order is instructed from the operator, main controller 20 loads a reference wafer (a resist is coated on its surface) having a plurality of reference marks arranged as is designed formed on wafer table WTB1 or WTB2, and loads a measurement reticle having a plurality of marks placed in a predetermined positional relation on reticle stage RST. Then, exposure is performed, for example, in a step-and-repeat method (or a step-and-scan method). After the exposure has been completed, main controller 20 carries the reference wafer after exposure, for example, to a coater/developer which is in-line connected to exposure apparatus 100, and with this gives instructions for development. Then, when receiving notice that development of the reference wafer has been completed from the coater/developer, main controller 20 loads the reference wafer after development again on wafer table WTB1 or WTB2, and sequentially detects a position with respect to the reference mark corresponding to the mark consisting of the resist image formed on the reference wafer, for example, with alignment system ALG. Then, based on the detection results, correction of the variation quantity of $\alpha$, $\beta$ and Z grids subject to higher-order components is performed.

Other than this, a setting can be employed, in which, for example, the operator sets a threshold value (for example, a third amount defined beforehand which is larger than the second quantity) for the variation quantity (correction quantity) of the low-order component (primary component) previously described, and main controller 20 monitors whether the variation quantity of the low-order component exceeds the threshold value or not, and in the case the variation quantity (correction quantity) exceeds the threshold value, a notice is to be sent to the operator informing that grid maintenance is required. That is, the variation quantity (correction quantity) of the low-order component previously described can be used as a monitor index to judge whether or not grid maintenance is required.

As is described in detail so far, according to exposure apparatus 100 related to the present embodiment, for example, when wafer stage WST1 (or WST2) is located in the movement area at the time of exposure such as during exposure, wafer table WTB1 or WTB2 (wafer stage WST1 or WST2) is driven by main controller 20, based on positional information in directions of six degrees of freedom obtained using three of encoders $70_1$ to $70_4$ of encoder system 70 (or three of encoders $71_1$ to $71_4$ of encoder system 71). And concurrently with this driving of wafer table WTB1 or WTB2 (wafer stage WST1 or WST2), by main controller 20, in the head group facing scale plate 21 of the first head group $61_1$, the second head group $61_2$, the third head group $61_3$ and the fourth head group $61_4$, difference data of measurement values in measurement directions ($\alpha$ direction and Z direction, or $\beta$ direction and Z direction) of one head $60_i$ serving as a reference belonging to each group and two heads $60_{ia}$ and $60_{ib}$ (i=1 to 4), respectively, are taken in, and based on the difference data which are taken in, it becomes possible to monitor variation quantity of grids in measurement directions ($\alpha$ direction and Z direction, or $\beta$ direction and Z direction) for sections corresponding to four sections $21_1$ to $21_4$ of two-dimensional grating RG formed on the lower surface of scale plate 21, respectively. Further, by main controller 20, calibration (correction) of the grid errors (especially the low-order component), that is, refreshing of the coordinate systems of encoder systems 70, 71 is performed in a real-time manner. Therefore, according to exposure apparatus 100, by encoder system 70 or 71 with two-dimensional grating RG formed on the lower surface of scale plate 21 serving as a measurement surface, position in direction of six degrees of freedom within the movement area at the time of exposure of wafer stage WST1 or WST2 can be measured and controlled with good accuracy for over a long period, which in turn allows the pattern of reticle R to be transferred with good accuracy on the plurality of shot areas on wafer W.

In exposure apparatus 100 related to the present embodiment, by main controller 20, refreshing of the coordinate systems of encoder systems 70, 71 is executed in a real-time manner on exposure and the like. Therefore, even if in the case scale plate 21 (two-dimensional grating RG) increases furthermore in size along with wafer stages WST1, WST2 to cope with 450 mm wafers, it becomes possible to measure the position in directions of six degrees of freedom within the movement area at the time of exposure of wafer table WTB1 or WTB2 with good accuracy for over a long period.

Further, in exposure apparatus 100, main controller 20 can execute refreshing of the coordinate systems of encoder systems 70, 71 in a real-time manner, while wafer stage WST1 or WST2 is moving within the movement area at the time of measurement such as during wafer alignment measurement (mark detection by alignment system ALG) and at the time of detection of positional information in the Z-axis direction (height difference information/unevenness information) of the wafer W surface which is performed concurrently with the wafer alignment. In such a case, accuracy of wafer alignment such as EGA and focus/leveling control accuracy of wafer W during scanning exposure can be maintained at high precision for over a long period.

Furthermore, in exposure apparatus 100 related to the present embodiment, placement spacing A, B of heads $60_1$ to $60_4$ are each decided to be larger than the sum of widths ai, bi of the openings of scale plates 21, 22 and sizes W, L of the shot areas, respectively. This allows positional information of wafer stages WST1, WST2 to be measured without switching heads $60_1$ to $60_4$ during scanning (constant velocity) drive of wafer stages WST1, WST2 that hold the wafer for exposure of the wafer. Accordingly, the pattern can be formed on the wafer with good precision, and overlay accuracy can be maintained with high precision, especially from exposure of a second layer (second layer) onward.

Incidentally, in the description of the embodiment above, while the four heads $60_1$, $60_2$, $60_3$, $60_4$ for position measurement of the wafer table provided at the four corners of the wafer table upper surface satisfy the placement conditions described above, as is obvious from the placement of heads $60_{ia}$, $60_{ib}$ and $60_i$ belonging to each head group $61_i$ (i=1 to 4) (refer to FIG. 2), heads $60_{1a}$, $60_{2a}$, $60_{3a}$, $60_{4a}$, and heads $60_{1b}$, $60_{2b}$, $60_{3b}$, $60_{4b}$ also satisfy placement conditions similar to the conditions described above.

Incidentally, in the embodiment above, while the case has been described where scale plates 21, 22 are each structured from four sections and four head groups $61_1$ to $61_4$ corresponding to this are provided on wafer stages WST1, WST2, the present invention is not limited to this, and scale plates 21, 22 can be structured from a single member. In this case, two-dimensional grating RG can be a single two-dimensional grating having a large area. In such a case, when movement strokes of wafer stages WST1, WST2 are sufficiently large, in addition to two heads (for example, two of heads $60_1$ to $60_4$) that allow position measurement of wafer stages WST1, WST2 in a predetermined degrees of freedom, such as for example, six degrees of freedom along with head $60_1$, only two redundant heads $60_{1a}$, $60_{1b}$ belonging to the first head group $61_1$ can be provided.

Further, the placement of the heads belonging to each head group in the description of the embodiment above is a mere example. For example, as a placement of the heads belonging to the first head group, a placement can be employed as is shown in, for example, FIG. 11A. In this case, on refreshing of the coordinate system, refreshing of the coordinate system can be performed in a similar manner as in the embodiment above by supposing that the function expressing the drift shape (variation of α, β, Z grids) previously described is not function x, y, but is function α, β.

Figure 11A:
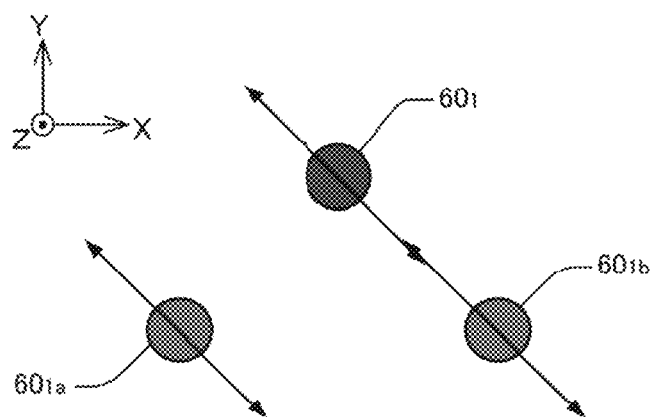
FIGS. 11A and 11B are views that show other placement examples of heads belonging to each head group.
Figure 11B:
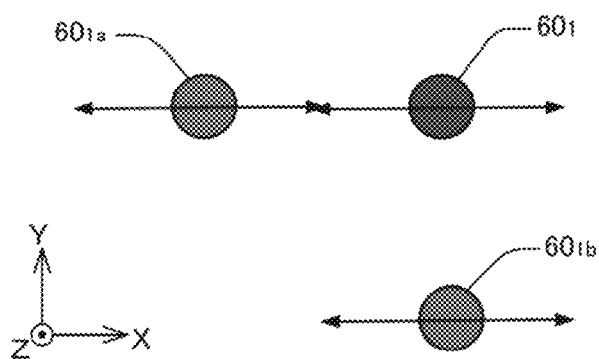

Or, as a placement of the heads belonging to the first head group $61_1$, for example, a placement can be employed as is shown in FIG. 11B. In this case, measurement directions of heads $60_1$, $60_{1a}$, $60_{1b}$ are in 2 directions, which are the X-axis direction and the Z-axis direction. Accordingly, in the first section of scale plate 21 where the heads belonging to the first head group $61_1$ faces, a one-dimensional or a two-dimensional grating is provided having a periodic direction at least in the X-axis direction. In the case the placement shown in FIG. 11A or FIG. 11B is employed as the placement of the heads belonging to the first head group, as the placement for the heads belonging to each of the second head group, the third head group, and the fourth head group, a placement point-symmetric to the placement shown in FIG. 11A or FIG. 11B with respect to the wafer table center or line-symmetric to the placement shown in FIG. 11A or FIG. 11B with respect to a straight line parallel to the X-axis or the Y-axis that passes through the center (however, the measurement direction within the XY plane of a head belonging to at least one group of the second head group, the third head group, and the fourth head group is orthogonal to the measurement direction of the head belonging to the first head group) is employed.

Incidentally, while the case has been described where three heads belong to each head group, the embodiment is not limited to this, and each head group may have two heads. For example, in the case at least one direction of the X-axis direction and the Y-axis direction is included in the measurement direction of the two heads, these two heads are preferably placed apart in directions intersecting the X-axis and the Y-axis, for example, similarly to heads $60_{1a}$, $60_{1b}$ in FIG. 11B. Further, in the case at least one direction of the α direction and the β direction previously described is included in the measurement direction of the two heads, these two heads are preferably placed apart in the X-axis direction (or the Y-axis direction) intersecting the α direction and the β direction, for example, similarly to heads $60_{1a}$, $60_{1b}$ in FIG. 11A.

Or, four or more heads may belong to each head group. Also in this case, a placement of the heads is employed in which all heads belonging to each head group are not positioned on the same straight line. In this case, on the refreshing of the coordinate system at the time of exposure previously described, difference data of measurement values in a common measurement direction of the head serving as a reference and of each of the remaining heads belonging to each head group that are used for measurement of positional information in directions of six degrees of freedom of the wafer table can be acquired, or difference data in the common measurement direction of all heads different from one another belonging to each head group can be acquired. The point is, any placement can be employed as long as difference data in the common measurement direction of the heads different from one another belonging to each head group, including the difference data of the measurement values in the common measurement direction of the head serving as a reference and of at least two heads of each of the remaining heads belonging to each head group that are used for the measurement of positional information belonging to each head group are acquired, and based on the difference data which has been acquired, variation quantity of the grid in the common measurement direction of scale plate 21 (two-dimensional grating RG) is monitored and the grid error can be calibrated.

In the case four or more heads belong to each head group, at the time of refreshing of the coordinate system, because more difference data can be acquired in the X-axis or the Y-axis direction at one time, calibration of grid variation quantity (grid error) targeting on components of a predetermined order which is a second order or more can be performed real time. And, in this case, as a mode of "a more detailed grid error correction" previously described, calibration of grid variation quantity (grid error) targeting on components of a higher order than the predetermined order can be performed similarly to the previous description, for example, using a reference wafer and the like.

Incidentally, in the embodiment described above, while the case has been described where only the measurement value of one head serving as a reference of the three heads belonging to each head group is used for calculating the position of wafer tables WTB1, WTB2 in directions of six degrees of freedom, the embodiment is not limited to this, and measurement values of at least two of the three heads belonging to each head group can be used to calculate the position of wafer tables WTB1, WTB2 in directions of six degrees of freedom. For example, an average of the measurement values of the three heads belonging to each head group can be used to calculate the position of wafer tables WTB1, WTB2 in directions of six degrees of freedom. In such a case, by an averaging effect, position measurement of a higher accuracy becomes possible.

Further, in the embodiment above, while the case has been described where a two-dimensional head having a measurement direction in two directions which are one direction within the XY plane and the Z-axis direction was used as each head, and grid error calibration (correction) of the coordinate system at the time of exposure is performed in the two directions, the embodiment is not limited to this. For example, the grid error calibration (correction) of the coordinate system at the time of exposure can be performed in one direction of the one direction within the XY plane and the Z-axis direction. Further, as each head, a three-dimensional head having measurement directions in two directions orthogonal within the XY plane and the Z-axis direction can be used. Or, for example, as heads $60_{ia}, 60_{ib}$, a one-dimensional head or a two-dimensional head $60_i$ head $60_i$ consisting of a two-dimensional head or a three-dimensional head that has at least one common measurement direction of the two or three measurement directions of head $60_i$, can be used. In the case of using a one-dimensional head whose measurement direction is in an uniaxial direction within the XY plane, combined with this, a surface position sensor of a non-encoder method whose measurement direction is in the Z-axis direction can be employed.

Incidentally, in the embodiment described above, while the example was described where two-dimensional gratings RG were formed scale on the lower surfaces of sections $21_1$ to $21_4$, $22_1$ to $22_4$ of plates 21, 22, respectively, the embodiment is not limited to this, and the embodiment described above can also be applied in the case a one-dimensional grating is formed whose periodic direction is only the measurement direction of the corresponding encoder heads $60_1$ to $60_4$ (the uniaxial direction within the XY plane).

Further, in the embodiment described above, while the exposure apparatus was described equipped with an encoder system having heads mounted on wafer stages WST1, WST2 and scale plates 21, 22 (two-dimensional gratings RG) placed external to wafer stages WST1, WST2, the embodiment is not limited to this, and can also be applied to an exposure apparatus equipped with a type of encoder system that has a plurality of heads provided external to the wafer stage, such as for example, above (or below), and a measurement surface such as a grating and the like provided facing this, on the upper surface (or lower surface) of the wafer stage, such as the exposure apparatus and the like disclosed in, for example, U.S. Patent Application Publication No. 2008/0088843 and the like.

Incidentally, in the embodiment described above, while the case has been described where the exposure apparatus was a scanning stepper, the embodiment is not limited to this, and the embodiment described above can also be applied to a stationary type exposure apparatus such as a stepper. In the case of a stepper and the like, by measuring the position of the stage on which an object subject to exposure is mounted with the encoder, generation of position measurement error caused by air fluctuation can be suppressed to almost zero different from the case when measuring the position of the stage by an interferometer, and based on measurement values of the encoder, positioning of the stage can be performed with high precision, and transfer of the reticle pattern onto the wafer can consequently be performed with high precision. Further, the embodiment above can also be applied to a projection exposure apparatus by a step-and-stitch method in which a shot area and a shot area are synthesized.

Further, in the embodiment described above, while the example was given in the case exposure apparatus 100 is a twin stage type exposure apparatus equipped with two wafer stages, the embodiment is not limited to this, and as is disclosed in, for example, U.S. Patent Application Publication No. 2007/0211235 and U.S. Patent Application Publication No. 2007/0127006 and the like, the embodiment described above can also be applied to an exposure apparatus which is equipped with a measurement stage including a measurement member (such as, for example, a reference mark, and/or a sensor) separate from the wafer stage, or a single stage exposure apparatus which is equipped with one wafer stage.

Further, the exposure apparatus in the embodiment described above can be a liquid immersion type as is disclosed in, for example, PCT International Publication No. 99/49504, U.S. Patent Application Publication No. 2005/0259234 and the like.

Further, the projection optical system in the exposure apparatus in the embodiment described above is not limited only to a reduction system, and can either be an equal magnifying or a magnifying system, and projection optical system PL is not limited only to a refractive system, and can either be a reflection system or a catadioptric system, and the projection image can either be an inverted image or an erected image.

Further, illumination light IL is not limited to an ArF excimer laser beam (wavelength 193 nm), and can be ultraviolet light such as a KrF excimer laser beam (wavelength 248 nm), or a vacuum-ultraviolet light such as an F2 excimer laser beam (wavelength 157 nm). As is disclosed in, for example, U.S. Pat. No. 7,023,610, as the vacuum-ultraviolet light, a harmonic wave can be used which is obtained by amplifying a single wavelength laser beam in an infrared or visible range oscillated from a DFB semiconductor laser or a fiber laser, with a fiber amplifier doped with, for example, erbium (or both erbium and ytterbium) and performing wavelength conversion into an ultraviolet light using a non-linear optical crystal.

Further, in the embodiment described above, while a transmissive mask (reticle) on which a predetermined light shielding pattern (or a phase pattern or a light attenuation pattern) was formed on the transmissive substrate, was used, instead of this reticle, as is disclosed in, for example, U.S. Pat. No. 6,778,257, an electron mask (also called a variable shaped mask, an active mask, or an image generator, and includes, for example, a DMD (Digital Micro-mirror Device) which is a kind of a non-emission type image display device (spatial light modulator) and the like) which forms a light-transmitting pattern, a reflection pattern, or an emission pattern, based on electronic data of the pattern to be exposed can also be used. In the case of using such a variable shaped mask, because the stage on which the wafer or the glass plate and the like is mounted is scanned with respect to the variable shaped mask, by measuring the position of the stage by using the encoder, an effect equivalent to the embodiment described above can be obtained.

Further, the embodiment described above can also be applied to an exposure apparatus (lithography system) that forms a line-and-space pattern on wafer W by forming an interference fringe on wafer W, as is disclosed in PCT International Publication No. 2001/035168.

Furthermore, the embodiment described above can also be applied to an exposure apparatus which synthesizes two reticle patterns on a wafer via the projection optical system and performs double exposure almost simultaneously on a shot area on the wafer by performing scanning exposure once, as is disclosed in, for example, U.S. Pat. No. 6,611,316.

Further, the object on which the pattern should be formed (the object subject to exposure on which the energy beam is irradiated) in the embodiment above is not limited to the wafer, and may be other objects such as a glass plate, a ceramic substrate, a film member, or a mask blank.

Furthermore, the usage of the exposure apparatus is not limited to the exposure apparatus for manufacturing semiconductors and can be widely applied, for example, to an exposure apparatus for liquid crystals that transfers a liquid crystal display devices pattern onto a square-shaped glass plate, an exposure apparatus for manufacturing organic ELs, thin film magnetic head, an imaging element (such as a CCD), a micromachine and a DNA chip and the like. Further, the embodiment described above can also be applied to an exposure apparatus that transfers a circuit pattern onto a glass substrate or a silicon wafer for manufacturing not only microdevices such as semiconductor devices but also a reticle or a mask that is used in an optical exposure apparatus, and EUV exposure apparatus, an X-ray exposure apparatus, an electron beam exposure apparatus and the like.

Electronic devices such as semiconductor devices are manufactured through steps such as; a step for performing function/performance design of a device, a step for making a reticle based on the design step, a step for making a wafer from a silicon material, a lithography step for transferring a pattern of a mask (reticle) onto the wafer by the exposure apparatus (pattern formation apparatus) and the exposure method related to the embodiment previously described, a development step for developing the wafer which has been exposed, an etching step for removing by the etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, because the device pattern is formed on the wafer using the exposure apparatus of the embodiment described above in the exposure method previously described, a highly integrated device can be manufactured with good productivity.

Further, the exposure apparatus (pattern formation apparatus) of the embodiment described above is manufactured by assembling various kinds of subsystems that include the respective constituents which are recited in the claims of the present application so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the PCT International Publications, the U.S. patent application Publications and the U.S. patents that are cited in the description so far related to exposure apparatuses and the like are each incorporated herein by reference.

INDUSTRIAL APPLICABILITY

As described so far, the exposure apparatus and the exposure method of the present invention is suitable for exposing an object. Further, the device manufacturing method of the present invention is suitable for manufacturing electronic devices such as semiconductor devices or liquid crystal display devices.

The invention claimed is:

1. An exposure apparatus that exposes a substrate with an illumination light via a projection optical system, the apparatus comprising:
a body having a metrology frame that supports the projection optical system;
a first scale member disposed to be substantially parallel to a predetermined plane orthogonal to an optical axis of the projection optical system, the first scale member having four first sections in each of which a first reflective grating is formed and a first opening that is substantially defined by the four first sections, and the first scale member being provided at the metrology frame so that a lower end part of the projection optical system is disposed in the first opening;
a detection system provided at the metrology frame, away from the projection optical system;
a second scale member, different from the first scale member, that is disposed to be substantially parallel to the predetermined plane, the second scale member having four second sections in each of which a second reflective grating is formed and a second opening that is substantially defined by the four second sections, and the second scale member being provided at the metrology frame so that the detection system is disposed in the second opening;
a drive system having a first movable member and a second movable member that hold a substrate, respectively, and a planar motor to drive the first and second movable members, that are disposed below the first and second scale members, the drive system moving the first and second movable members by the planar motor, respectively, so that an exposure operation of the substrate is performed in an exposure station where the projection optical system is disposed and a detection operation of the substrate is also performed in a measurement station where the detection system is disposed, along with moving the first and second movable members from one of the exposure station and the measurement station to the other of the exposure station and the measurement station;
an encoder system that measures position information of the first and second movable members in the exposure station and the measurement station, the encoder system having four first head groups provided at the first movable member, with each of the groups having a plurality of heads, and four second head groups provided at the second movable member, with each of the groups having a plurality of heads, and each of the plurality of heads irradiates either the first reflective grating or the second reflective grating that the plurality of heads face from below with a measurement beam, so that position information of the first movable member is measured with at least three of the four first head groups, along with position information of the second movable member being measured with at least three of the four second head groups; and a controller coupled to the drive system and the encoder system, the controller moving the first and second movable members by the planar motor, so that each of the four first head groups faces the four first sections in the exposure station and also the four second sections in the measurement station, along with each of the four second head groups facing the four first sections in the exposure station and also the four second sections in the measurement station;

wherein each of the four first head groups or the four second head groups facing the four first sections measures the position information by the plurality of heads so that difference data of the position information is acquired in at least one of two directions orthogonal to each other within the predetermined plane, and each of the four first head groups or the four second head groups facing the four second sections measures the position information by the plurality of heads so that difference data of the position information is acquired in at least one of the two directions, and the controller compensates a grid error due to grid variation caused by the first reflective grating in each of the four first sections in a direction parallel to the predetermined plane, based on the difference data acquired by the four first head groups or the four second head groups facing the four first sections, along with compensating a grid error due to grid variation caused by the second reflective grating in each of the four second sections in a direction parallel to the predetermined plane, based on the difference data acquired by the four first head groups or the four second head groups facing the four second sections.

2. The exposure apparatus according to claim 1, wherein the four first head groups have two first head groups, disposed apart in one of the two directions, which are each capable of measuring the position information in the other of the two directions, and two first head groups, disposed apart in the other of the two directions, which are each capable of measuring the position information in the one of the two directions, and the four second head groups have two second head groups, disposed apart in one of the two directions, which are each capable of measuring the position information in the other of the two directions, and two second head groups, disposed apart in the other of the two directions, which are each capable of measuring the position information in the one of the two directions.

3. The exposure apparatus according to claim 1, wherein the four first head groups have two first head groups disposed at a spacing wider than a width of the first opening in a first direction within the predetermined plane, and away from the two first head groups, two first head groups disposed at an interval wider than the width of the first opening in a second direction orthogonal to the first direction within the predetermined plane, the four second head groups have two second head groups disposed at a spacing wider than a width of the second opening in the first direction, and away from the two second head groups, two second head groups disposed at an interval wider than the width of the second opening in the second direction, and the two directions are different from the first and second directions at an angle of 45 degrees in a rotational direction within the predetermined plane.

4. The exposure apparatus according to claim 3, wherein one head group in the two first head groups is capable of measuring the position information in one of the two directions, and the other head group is also capable of measuring the position information in the other of the two directions, and one head group in the two second head groups is capable of measuring the position information in one of the two directions, and the other head group is also capable of measuring the position information in the other of the two directions.

5. The exposure apparatus according to claim 1, wherein the plurality of heads includes at least two heads that are capable of measuring the position information in one of the two directions and are also different in position from each other in the other of the two directions.

6. The exposure apparatus according to claim 5, wherein the plurality of heads includes at least one head that is different in position from a part of the at least two heads or all of the at least two heads in the one of the two directions.

7. The exposure apparatus according to claim 1, wherein the encoder system measures the position information in directions of six degrees of freedom, including a first direction and a second direction that are orthogonal to each other within the predetermined plane, and a third direction orthogonal to the predetermined plane, and each of the plurality of heads is capable of measuring the position information in one of the two directions and in the third direction.

8. The exposure apparatus according to claim 7, wherein the controller compensates a grid error due to grid variation caused by the first reflective grating in the third direction in each of the four first sections, along with compensating a grid error due to grid variation caused by the second reflective grating in the third direction in each of the four second sections.

9. The exposure apparatus according to claim 8, wherein the first and second scale members are supported in a suspended manner by the metrology frame so that the first and second scale members are substantially disposed in a same plane.

10. The exposure apparatus according to claim 7, wherein the two directions are different from the first and second directions at an angle of 45 degrees in a rotational direction within the predetermined plane.

11. A device manufacturing method, comprising:
exposing a substrate using the exposure apparatus according to claim 1; and
developing the substrate that has been exposed.

12. An exposure method of exposing a substrate with an illumination light via a projection optical system, the method comprising:
moving a first movable member and a second movable member that hold a substrate, respectively, below a first scale member and a second scale member provided at a metrology frame supporting the projection optical system and a detection system disposed away from the projection optical system, so that the first and second scale members are substantially parallel to a predetermined plane orthogonal to an optical axis of the projection optical system, each of the first and second movable members being moved by a planar motor so that an exposure operation of the substrate is performed in an exposure station where the projection optical system is disposed and a detection operation of the substrate is also performed in a measurement station where the detection system is disposed, along with being moved from one of the exposure station and the measurement station to the other;

measuring position information of the first and second movable members in the exposure station and the measurement station by an encoder system, the encoder system having four first head groups provided at the first movable member, with each of the groups having a plurality of heads, and four second head groups provided at the second movable member, with each of the groups having a plurality of heads, and each of the plurality of heads irradiates either a first reflective grating or a second reflective grating that the plurality of heads face from below with a measurement beam, so that position information of the first movable member is measured with at least three of the four first head groups, along with position information of the second movable member being measured with at least three of the four second head groups;

wherein the first scale member, having four first sections in each of which the first reflective grating is formed and a first opening that is substantially defined by the four first sections, is provided at the metrology frame so that a lower end part of the projection optical system is disposed within the first opening, and the second scale member, having four second sections in each of which the second reflective grating is formed and a second opening that is substantially defined by the four second sections, is provided at the metrology frame so that the detection system is disposed within the second opening, the first movable member is moved so that each of the four first head groups faces the four first sections in the exposure station and also faces the four second sections in the measurement station, along with the second movable member being moved so that each of the four second head groups faces the four first sections in the exposure station and also faces the four second sections in the measurement station, each of the four first head groups or the four second head groups facing the four first sections measures the position information by the plurality of heads so that difference data of the position information is acquired in at least one of two directions orthogonal to each other within the predetermined plane, and each of the four first head groups or the four second head groups facing the four second sections measures the position information by the plurality of heads so that difference data of the position information is acquired in at least one of the two directions, and a grid error, due to grid variation caused by the first reflective grating in each of the four first sections in a direction parallel to the predetermined plane, is compensated, based on the difference data acquired by the four first head groups or the four second head groups facing the four first sections, along with a grid error, due to grid variation caused by the second reflective grating in each of the four second sections in a direction parallel to the predetermined plane, being compensated, based on the difference data acquired by the four first head groups or the four second head groups facing the four second sections.

13. The exposure method according to claim 12, wherein position information of the first and second movable members is measured by the encoder system in directions of six degrees of freedom, including a first direction and a second direction that are orthogonal to each other within the predetermined plane, and a third direction orthogonal to the predetermined plane, and each of the plurality of heads is capable of measuring the position information in one of the two directions, and in the third direction.

14. The exposure method according to claim 13, wherein a grid error, due to grid variation caused by the first reflective grating, is compensated in each of the four first sections in the third direction, along with a grid error, due to grid variation caused by the second reflective grating, being compensated in each of the four second sections in the third direction.

15. The exposure method according to claim 13, wherein the two directions are different from the first and second directions at an angle of 45 degrees in a rotational direction within the predetermined plane.

16. A device manufacturing method, comprising:
exposing a substrate using the exposure method according to claim 12; and
developing the substrate that has been exposed.

17. A making method of an exposure apparatus that exposes a substrate with an illumination light via a projection optical system, the method comprising:

providing a body having a metrology frame that supports the projection optical system;

providing a first scale member disposed to be substantially parallel to a predetermined plane orthogonal to an optical axis of the projection optical system, the first scale member having four first sections in each of which a first reflective grating is formed and a first opening that is substantially defined by the four first sections, and the first scale member being provided at the metrology frame so that a lower end part of the projection optical system is disposed in the first opening;

providing a detection system that is provided at the metrology frame, away from the projection optical system;

providing a second scale member, different from the first scale member, that is disposed to be substantially parallel to the predetermined plane, the second scale member having four second sections in each of which a second reflective grating is formed and a second opening that is substantially defined by the four second sections, and the second scale member being provided at the metrology frame so that the detection system is disposed in the second opening;

providing a drive system having a first movable member and a second movable member that hold a substrate, respectively, and a planar motor to drive the first and second movable members, that are disposed below the first and second scale members, the drive system moving the first and second movable members by the planar motor, respectively, so that an exposure operation of the substrate is performed in an exposure station where the projection optical system is disposed and a detection operation of the substrate is also performed in a measurement station where the detection system is disposed, along with moving the first and second movable members from one of the exposure station and the measurement station to the other of the exposure station and the measurement station;

providing an encoder system that measures position information of the first and second movable members in the exposure station and the measurement station, the encoder system having four first head groups provided at the first movable member, with each of the groups having a plurality of heads, and four second head groups provided at the second movable member, with each of the groups having a plurality of heads, and each of the plurality of heads irradiates either the first reflective grating or the second reflective grating that the plurality of heads face from below with a measurement beam, so that position information of the first movable member is measured with at least three of the four first head groups, along with position information of the second movable member being measured with at least three of the four second head groups; and providing a controller coupled to the drive system and the encoder system, the controller moving the first and second movable members by the planar motor, so that each of the four first head groups faces the four first sections in the exposure station and also the four second sections in the measurement station, along with each of the four second head groups facing the four first sections in the exposure station and also the four second sections in the measurement station;

wherein each of the four first head groups or the four second head groups facing the four first sections measure the position information by the plurality of heads so that difference data of the position information is acquired in at least one of two directions orthogonal to each other within the predetermined plane, and each of the four first head groups or the four second head groups facing the four second sections measure the position information by the plurality of heads so that difference data of the position information is acquired in at least one of the two directions, and the controller compensates a grid error due to grid variation caused by the first reflective grating in each of the four first sections in a direction parallel to the predetermined plane, based on the difference data acquired by the four first head groups or the four second head groups facing the four first sections, along with compensating a grid error due to grid variation caused by the second reflective grating in each of the four second sections in a direction parallel to the predetermined plane, based on the difference data acquired by the four first head groups or the four second head groups facing the four second sections.

* * * * *

UNITED STATES PATENT AND TRADEMARK OFFICE
CERTIFICATE OF CORRECTION

| | |
|---|---|
| PATENT NO. | : 11,579,532 B2 |
| APPLICATION NO. | : 17/563419 |
| DATED | : February 14, 2023 |
| INVENTOR(S) | : Yuichi Shibazaki |

It is certified that error appears in the above-identified patent and that said Letters Patent is hereby corrected as shown below:

In the Specification

At Column 18, Line number 12, please delete "$60_2$, $60_2$, $60_4$" and insert --$60_1$, $60_2$, $60_4$--.

At Column 18, Line number 20, please delete "$60_2$, $60_2$, $60_4$" and insert --$60_1$, $60_2$, $60_4$--.

At Column 25, Line number 27, please delete "$60_1$ to $60_4$" and insert --$60_2$ to $60_4$--.

In the Claims

At Column 32, Line number 41, please delete "9. The exposure apparatus according to claim 8, wherein the first and second scale members are supported in a suspended manner by the metrology frame so that the first and second scale members are substantially disposed in a same plane" and insert --9. The exposure apparatus according to claim 7, wherein the two directions are different from the first and second directions at an angle of 45 degrees in a rotational direction within the predetermined plane--.

At Column 32, Line number 46, please delete "10. The exposure apparatus according to claim 7, wherein the two directions are different from the first and second directions at an angle of 45 degrees in a rotational direction within the predetermined plane" and insert --10. The exposure apparatus according to claim 8, wherein the first and second scale members are supported in a suspended manner by the metrology frame so that the first and second scale members are substantially disposed in a same plane--.

Signed and Sealed this
Thirteenth Day of June, 2023

*Katherine Kelly Vidal*
Katherine Kelly Vidal
*Director of the United States Patent and Trademark Office*